(12) United States Patent
Jeong

(10) Patent No.: US 12,069,920 B2
(45) Date of Patent: Aug. 20, 2024

(54) DISPLAY DEVICE

(71) Applicant: Samsung Display Co., Ltd., Yongin-si (KR)

(72) Inventor: Kwangjin Jeong, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 18/316,445

(22) Filed: May 12, 2023

(65) Prior Publication Data

US 2023/0284494 A1    Sep. 7, 2023

Related U.S. Application Data

(63) Continuation of application No. 17/879,301, filed on Aug. 2, 2022, now Pat. No. 11,678,540, which is a continuation of application No. 17/060,531, filed on Oct. 1, 2020, now Pat. No. 11,404,528.

(30) Foreign Application Priority Data

Dec. 27, 2019    (KR) .................... 10-2019-0176263

(51) Int. Cl.
    *H10K 59/131*    (2023.01)
    *H10K 59/121*    (2023.01)

(52) U.S. Cl.
    CPC .......... *H10K 59/131* (2023.02); *H10K 59/121* (2023.02)

(58) Field of Classification Search
    CPC .................... H10K 59/121; H10K 59/131
    See application file for complete search history.

(56) References Cited

U.S. PATENT DOCUMENTS

| 8,964,279 | B2 | 2/2015 | Melcher et al. |
| 10,347,179 | B2 | 7/2019 | Kim et al. |
| 2010/0253610 | A1 | 10/2010 | Lee et al. |
| 2020/0135973 | A1* | 4/2020 | Ma ................... H01L 33/24 |
| 2020/0168671 | A1 | 5/2020 | Jang et al. |
| 2020/0175918 | A1 | 6/2020 | An et al. |
| 2020/0286439 | A1 | 9/2020 | Koide et al. |
| 2020/0302878 | A1 | 9/2020 | Kato et al. |
| 2021/0167160 | A1 | 6/2021 | Um et al. |
| 2021/0173274 | A1 | 6/2021 | Shiina |
| 2021/0225269 | A1 | 7/2021 | Yang et al. |

FOREIGN PATENT DOCUMENTS

| CN | 207947006 | 10/2018 |
| KR | 10-2018-0023101 | 3/2018 |
| WO | 2017/075103 | 5/2017 |

* cited by examiner

*Primary Examiner* — Douglas M Menz
(74) *Attorney, Agent, or Firm* — KILE PARK REED & HOUTTEMAN PLLC

(57) ABSTRACT

A display device includes a substrate including a first area and a second area, main pixel groups, auxiliary pixel groups, first signal lines, and second signal lines, wherein a distance between adjacent ones of the first signal lines in the second area gradually decreases toward outer regions of the second area from a center of the second area, and a distance between adjacent ones of the second signal lines in the second area gradually decreases toward the outer regions of the second area from the center of the second area.

14 Claims, 13 Drawing Sheets

DISPLAY DEVICE

CROSS-REFERENCE TO RELATED APPLICATIONS

This is a continuation application of U.S. patent application Ser. No. 17/879,301; filed Aug. 2, 2022, now U.S. Pat. No. 11,678,540 issued Jun. 13, 2023; the disclosure of which is incorporated herein by reference in its entirety. U.S. patent application Ser. No. 17/879,301 is a continuation application of U.S. patent application Ser. No. 17/060,531; filed Oct. 1, 2020, now Pat. No. 11,404,528, issued Aug. 2, 2022, the disclosure of which is incorporated herein by reference in its entirety. U.S. patent application Ser. No. 17/060,531 claims priority to and benefits of Korean Patent Application No. 10-2019-0176263 under 35 U.S.C. § 119, filed on Dec. 27, 2019, in the Korean Intellectual Property Office, the entire contents of which are incorporated herein by reference.

BACKGROUND

1. Technical Field

One or more embodiments relate to a display device having enhanced product reliability.

2. Description of Related Art

Display devices have recently been applied to a diverse range of uses; Since the thicknesses and weights of display devices have decreased, the range of use thereof has been widening.

As display devices are being utilized in various ways, the shapes of the display devices may be designed in various ways. Functions that may be combined with or linked to display devices have also increased.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display device having an area in which a sensor or the like may be arranged or disposed inside of a display area in order to increase functions that may be combined with or linked to such a display device or display devices. However, these objectives are just examples, and the scope of the disclosure is not limited thereby.

Additional aspects will be set forth in part in the description which follows and, in part, will be apparent from the description, or may be learned by practice of the embodiments.

According to one or more embodiments, a display device may include a substrate including a first area and a second area, the second area having a transmission area, a plurality of main pixel groups disposed in the first area, a plurality of auxiliary pixel groups disposed in the second area, a plurality of first signal lines that electrically connect the plurality of main pixel groups to the plurality of auxiliary pixel groups, the plurality of first signal lines extending in a first direction, and a plurality of second signal lines that electrically connect the plurality of main pixel groups to the plurality of auxiliary pixel groups, the plurality of second signal lines extending in a second direction intersecting the first direction. A distance between adjacent ones of the plurality of first signal lines in the second area may gradually decrease toward outer portions of the second area from a center of the second area, and a distance between adjacent ones of the plurality of second signal lines in the second area may gradually decrease toward the outer portions of the second area from the center of the second area.

A distance between adjacent ones of the plurality of first signal lines in the first area may be less than or equal to the distance between adjacent ones of the plurality of first signal lines in the second area.

A distance between adjacent ones of the plurality of second signal lines in the first area may be less than or equal to the distance between adjacent ones of the plurality of second signal lines in the second area.

A distance between adjacent ones of the plurality of auxiliary pixel groups disposed in the first direction may gradually decrease toward the outer portions of the second area from the center of the second area.

A distance between adjacent ones of the plurality of auxiliary pixel groups disposed in the second direction may gradually decrease toward the outer portions of the second area from the center of the second area.

A distance between adjacent ones of the plurality of main pixel groups disposed in the first direction may be less than or equal to a distance between adjacent ones of the plurality of auxiliary pixel groups disposed in the first direction.

A distance between adjacent ones of the plurality of main pixel groups disposed in the second direction may be less than or equal to a distance between adjacent ones of the plurality of auxiliary pixel groups disposed in the second direction.

Each of the plurality of auxiliary pixel groups may include a first auxiliary pixel, a second auxiliary pixel, and a third auxiliary pixel that may emit light of different wavelengths.

Each of the plurality of main pixel groups may include a first main pixel, a second main pixel, and a third main pixel that may emit light of different wavelengths.

Each of the plurality of second signal lines may include a first conductive line, a second conductive line, and a third conductive line.

A portion of the first conductive line may be electrically connected to the first auxiliary pixel, a portion of the second conductive line may be electrically connected to the second auxiliary pixel, and a portion of the third conductive line may be electrically connected to the third auxiliary pixel.

The first conductive line may be electrically connected to the first main pixel, the second conductive line may be electrically connected to the second main pixel, and the third conductive line may be electrically connected to the third main pixel.

At least one of the plurality of first signal lines may include first signal lines extending in the first direction and disconnected each other by the second area between the disconnected first signal lines, and the disconnected first signal lines may be electrically connected by connection lines disposed along edges of the second area.

At least one of the plurality of second signal lines may include second signal lines extending in the second direction and disconnected each other by the second area between the disconnected second signal lines, and the disconnected second signal lines may be electrically connected by connection lines disposed along edges of the second area.

According to one or more embodiments, a display device may include a substrate including a first area and a second area, the second area having a transmission area, a plurality of main pixel groups disposed in the first area, a plurality of auxiliary pixel groups disposed in the second area, a plurality of first signal lines that electrically connect the plurality of main pixel groups to the plurality of auxiliary pixel groups, the plurality of first signal lines extending in a first direction, a plurality of second signal lines that electrically connect the plurality of main pixel groups to the plurality of auxiliary pixel groups, the plurality of second signal lines extending in a second direction intersecting the first direction, and a component disposed below the substrate to correspond to the second area and including an electronic element emitting or receiving light, wherein a distance between adjacent ones of the plurality of first signal lines in the second area gradually decreases toward outer portions of the second area from a center of the second area, and a distance between adjacent ones of the plurality of second signal lines in the second area gradually decreases toward the outer portions of the second area from the center of the second area.

A distance between adjacent ones of the plurality of first signal lines in the first area may be less than or equal to a distance between adjacent ones of the plurality of first signal lines in the second area.

A distance between adjacent ones of the plurality of second signal lines in the first area may be less than or equal to a distance between adjacent ones of the plurality of second signal lines in the second area.

A distance between adjacent ones of the plurality of auxiliary pixel groups disposed in the first direction may gradually decrease toward the outer portions of the second area from the center of the second area.

A distance between adjacent ones of the plurality of auxiliary pixel groups disposed in the second direction may gradually decrease toward the outer portions of the second area from the center of the second area.

Each of the plurality of auxiliary pixel groups may include a first auxiliary pixel, a second auxiliary pixel, and a third auxiliary pixel that may emit light of different wavelengths.

Other aspects, features, and advantages than the above-described aspects, features, and advantages will be apparent from the following drawings, the claims, and a detailed description of the disclosure.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
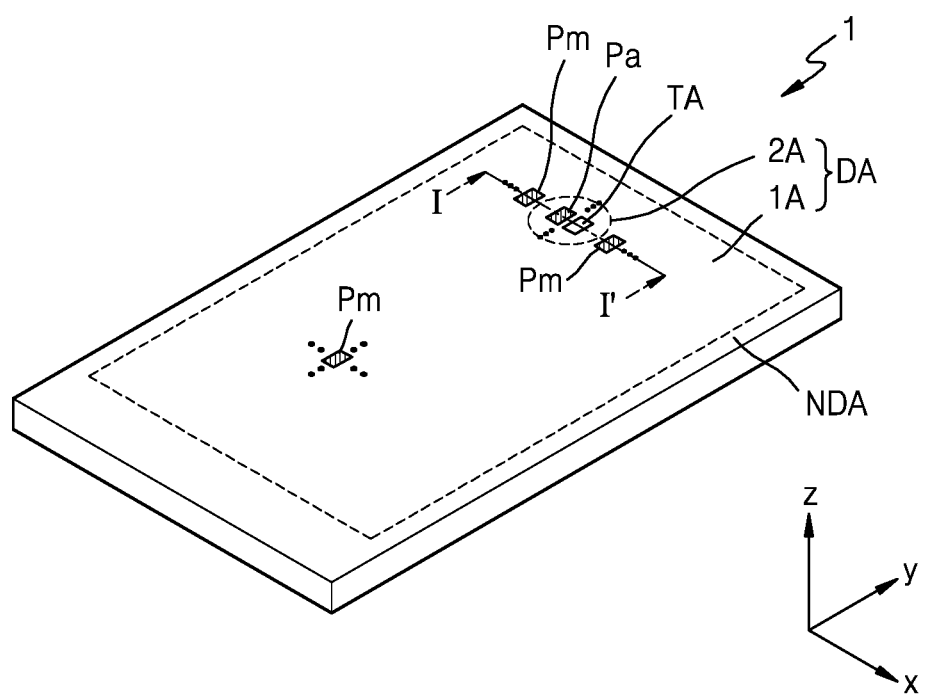
FIG. 1 is a perspective view schematically illustrating a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, embodiments will be described below in more detail with reference to the accompanying drawings. Those elements that are the same or are in correspondence are rendered the same reference numeral regardless of the figure number, and a redundant description therewith is omitted.

It will be understood that although the terms "first," "second," etc. may be used herein to describe various components, these components should not be limited by these terms. These terms are only used to distinguish one element from another. For instance, a first element discussed below could be termed a second element without departing from the teachings of the disclosure. Similarly, the second element could also be termed the first element.

As used herein, the singular forms "a," "an" and "the" are intended to include the plural forms as well, unless the context clearly indicates otherwise.

It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The x-axis, the y-axis and the z-axis are not limited to three axes of the rectangular coordinate system, and may be interpreted in a broader sense. For example, the x-axis, the y-axis, and the z-axis may be perpendicular to one another, and may represent different directions that may not be perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when a layer, region, or element is referred to as being "connected to" or "coupled to" another layer, region, or element, it can be directly connected or coupled to the other layer, region, or element or intervening layers, regions, or elements may be present. For example, as used herein, when a layer, region, or element is referred to as being "electrically connected to" another layer, region, or element, it can be directly electrically connected to the other layer, region, or element or intervening layers, intervening regions, or intervening elements may be present.

Also, when an element is referred to as being "in contact" or "contacted" or the like to another element, the element may be in "electrical contact" or in "physical contact" with another element; or in "indirect contact" or in "direct contact" with another element.

When an embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view schematically illustrating a display device according to an embodiment.

Referring to FIG. 1, a display device 1 may include a display area DA, in which an image or images may be realized, and a non-display area NDA, in which an image or images may not be realized. The display area DA may include a first area 1A and a second area 2A, the second area 2A having a transmission area TA. The display device 1 may provide or display a main image or images by using light emitted from main pixels Pm arranged or disposed in the first area 1A and may provide or display an auxiliary image or images by using light emitted from auxiliary pixels Pa arranged or disposed in the second area 2A.

The second area 2A may be an area in which a component including an optical element may be located or disposed thereunder or there below, as will be described below with reference to FIG. 2. The second area 2A may include the transmission area TA through which light and/or sound output from a component to the outside or proceeding toward the component from the outside may transmit. In an embodiment, when infrared rays transmit through the second area 2A, light transmittance may be equal to or greater than about 30%, as an example, about 50%, about 75%, about 80%, about 85%, or about 90%.

In an embodiment, the auxiliary pixels Pa may be arranged or disposed in the second area 2A, and an image or images may be provided from the second area 2A by using light emitted from the auxiliary pixels Pa. The image or images provided from the second area 2A may be an auxiliary image or images and may have a lower resolution than that of an image or images provided from the first area 1A. For example, the second area 2A may have the transmission area TA through which light and/or sound may transmit. Thus, the number of auxiliary pixels Pa that may be arranged or disposed per unit area in the second area 2A may be less than the number of main pixels Pm arranged or disposed per unit area in the first area 1A.

Hereinafter, an organic light-emitting display device will be described as an example of a display device 1 according to an embodiment. However, the display device according to the disclosure is not limited thereto. In an embodiment, a variety of types of display devices including an inorganic electroluminescent (EL) display device, a quantum dot light-emitting display device, and the like may be used within the spirit and the scope of the disclosure.

In FIG. 1, the second area 2A may be at an upper side of the display area DA having a substantially rectangular shape. However, embodiments are not limited thereto. The shape of the display area DA may include a substantially circular shape, a substantially oval shape, or a substantially polygonal shape, such as a triangular shape, and the location of the second area 2A and the number of second areas 2A may be variously changed.

Figure 2:
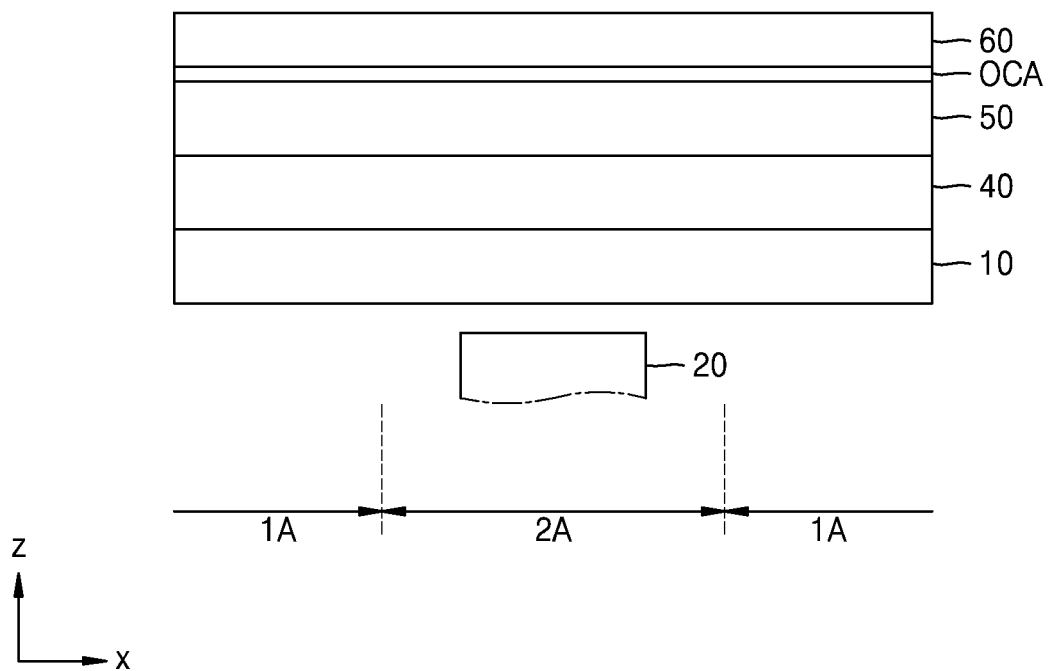
FIG. 2 is a schematic cross-sectional view schematically illustrating a display device according to an embodiment.

FIG. 2 is a schematic cross-sectional view schematically illustrating a display device according to an embodiment.

Referring to FIG. 2, the display device 1 may include a display panel 10, and an input sensing layer 40 and an optical functional layer 50, which may be arranged or disposed on the display panel 10. These elements may be covered or overlapped by a window 60. The window 60 may be combined with an element thereunder or there below, for example, the optical functional layer 50 through an adhesive layer such as an optically clear adhesive (OCA). The display device 1 may be provided in a variety of types of electronic devices, such as a mobile phone, a tablet personal computer (PC), a laptop computer, and a smart watch or any other devices within the spirit and the scope of the disclosure.

The display panel 10 may include diodes arranged or disposed in the display area DA. The input sensing layer 40 may attain coordinate information according to an external input, for example, a touch event. The input sensing layer 40 may include a sensing electrode and trace lines electrically connected to the sensing electrode. The input sensing layer 40 may be arranged or disposed on the display panel 10. The input sensing layer 40 may sense an external input by using a mutual capacitance method or self capacitance method.

The input sensing layer 40 may be located or disposed directly on the display panel 10. Alternatively, the input sensing layer 40 may be combined with the display panel 10 through an adhesive layer, such as an OCA. In an embodiment, as shown in FIG. 2, the input sensing layer 40 may be located or disposed directly on the display panel 10. In this case, the adhesive layer may not be disposed between the input sensing layer 40 and the display panel 10.

The optical functional layer 50 may include an antireflective layer. The antireflective layer may reduce the reflectivity of light (external light) incident toward the display panel 10 from the outside through the window 60. The optical functional layer 50 may include functional layers, such as a phase retarder and a polarizer. The phase retarder may be of a film type or liquid crystal coating type and may include a A/2 phase retarder and/or a A/4 phase retarder. The polarizer may also be of a film type or liquid crystal coating type. The film type may include an elongation-type synthetic resin film, and the liquid crystal coating type may include liquid crystals arranged or disposed in a certain or predetermined arrangement. The phase retarder and the polarizer may include a protective film.

The optical functional layer 50 may include structures such as a black matrix and color filters. The color filters may be arranged or disposed in consideration of colors of light emitted from the pixels of the display panel 10. In an embodiment, the optical functional layer 50 may include a destructive interference structure. The destructive interference structure may include a first reflective layer and a second reflective layer, which may be arranged or disposed on different layers. First reflected light and second reflected light reflected from the first reflective layer and the second reflective layer, respectively, may destructively interfere. Thus, the reflectivity of external light may be reduced.

The optical functional layer 50 may include a lens layer. The lens layer may enhance emission efficiency of light emitted from the display panel 10 or may reduce color deviation. The lens layer may include a layer having a concave or convex lens shape and/or layers having different refractive indices.

The component 20 may be located or disposed over the second area 2A. The component 20 may be an electronic element transmitting and/or receiving light or sound. For example, the component 20 may include an optical element, a sensor that may receive and use light, such as an infrared sensor, a sensor that may output or sense light or sound to measure a distance or to recognize a fingerprint, a small lamp that may output light, or a speaker that may output sound.

In an embodiment, when the display device 1 is used as a smart watch or a vehicle instrument panel, the component 20 may be a member, such as a watch needle or a needle for indicating information (for example, car speed).

The component 20 may include a component(s) adding a function to the display device 1, as described above, or a component, such as an accessory for increasing an esthetic sense of the display panel 10.

Figure 3A:
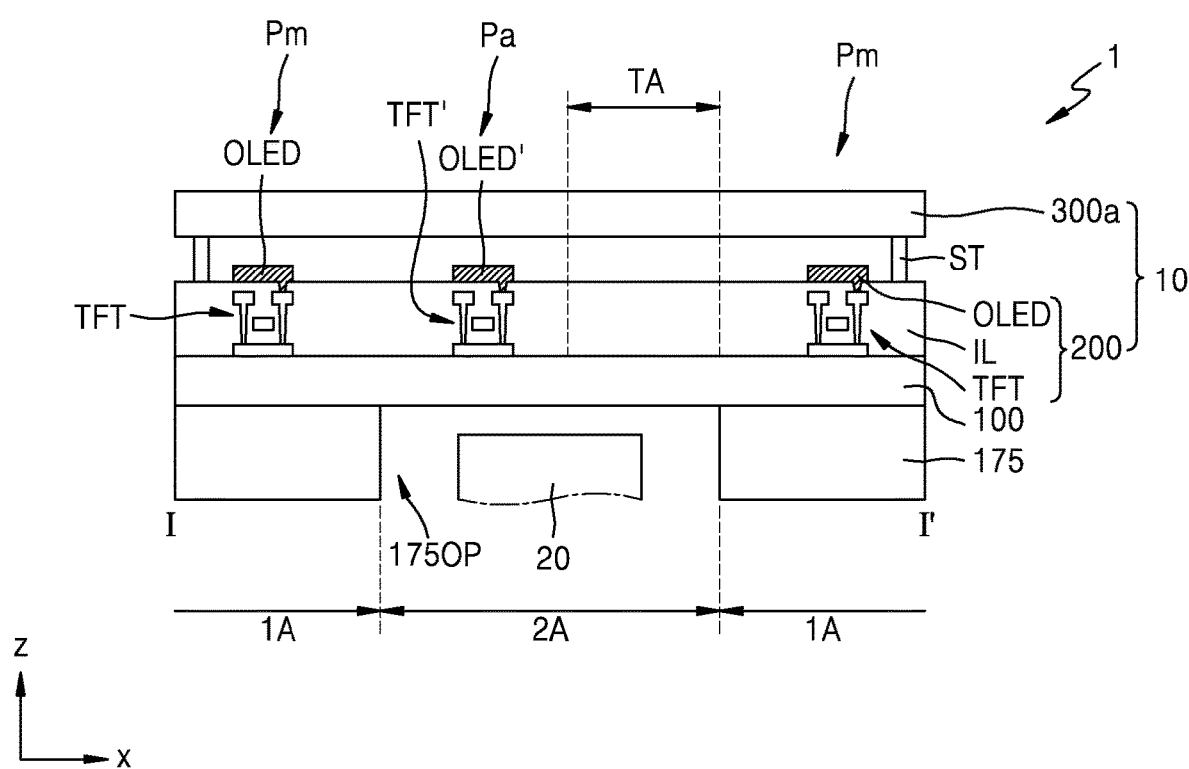
FIGS. 3A and 3B are schematic cross-sectional views schematically illustrating a display device according to an embodiment.
Figure 3B:
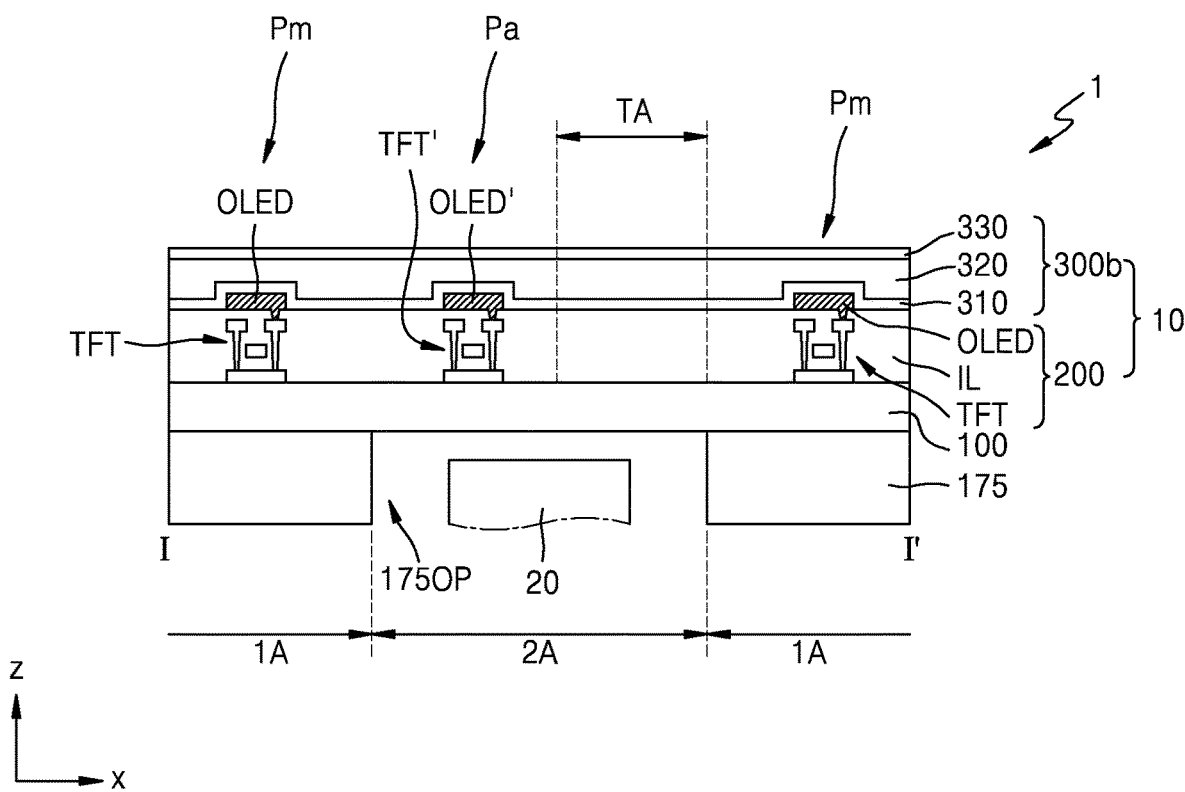

FIGS. 3A and 3B are schematic cross-sectional views schematically illustrating a display device according to an embodiment.

Referring to FIG. 3A, the display device 1 may include a display panel 10 including a display element and a component 20 located or disposed under or below the display panel 10 to correspond to the second area 2A.

The display panel 10 may include a substrate 100, a display element layer 200 located or disposed on the substrate 100, and an encapsulation substrate 300a that may be an encapsulation member that may seal the display element layer 200. The display panel 10 may include a lower protective film 175 located or disposed under or below the substrate 100.

The substrate 100 may include glass or polymer resin. The polymer resin may include polyethersulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including a layer including the polymer resin described above and an inorganic layer (not shown).

The display element layer 200 may include a circuit layer including thin-film transistors TFT and TFT', organic light-emitting diodes OLED and OLED' as display elements, and an insulating layer IL therebetween. Main pixels Pm including a main thin-film transistor TFT and a main organic light-emitting diode OLED electrically connected thereto may be arranged or disposed in the first area 1A, and auxiliary pixels Pa including an auxiliary thin-film transistor TFT' and an auxiliary organic light-emitting diode OLED' electrically connected thereto may be arranged or disposed in the second area 2A.

The transmission area TA, in which the auxiliary thin-film transistor TFT' and the display element may not be arranged or disposed, may be provided or disposed in the second area 2A. The transmission area TA may be understood as an area in which light/a signal emitted from the component 20 or light/a signal incident toward the component 20 transmits.

The display element layer 200 may be covered or overlapped by the encapsulation substrate 300a. The encapsulation substrate 300a may include a glass material. For example, the encapsulation substrate 300a may include a glass material having a main component of silicon oxide ($SiO_2$). The encapsulation substrate 300a may face the substrate 100, and a sealant ST may be disposed between the substrate 100 and the encapsulation substrate 300a. The sealant ST may be located or disposed on edges of the substrate 100 and may entirely surround the display element layer 200 between the substrate 100 and the encapsulation substrate 300a. When viewed from a direction perpendicular to a top surface of the substrate 100 (or on a plan view), the first area 1A and the second area 2A may be entirely surrounded by the sealant ST.

Referring to FIG. 3B, the display element layer 200 may be covered or overlapped by a thin-film encapsulation layer 300b. The thin-film encapsulation layer 300b may include at least one inorganic encapsulation layer and at least one organic encapsulation layer. In this regard, FIG. 3B illustrates first and second inorganic encapsulation layers 310 and 330 and an organic encapsulation layer 320 disposed therebetween.

The first and second inorganic encapsulation layers 310 and 330 may include one or more inorganic insulating materials of aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include acryl-based resin, epoxy-based resin, polyimide, and polyethylene.

The lower protective film 175 may be attached or adhered to a lower portion of the substrate 100 and may support and protect the substrate 100. The lower protective film 175 may include an opening 1750P corresponding to the second area 2A. The opening 1750P may be provided in the lower protective film 175 so that light transmittance of the second area 2A may be increased. The lower protective film 175 may include polyethylene terephthalate or polyimide, by way of example.

The area of the second area 2A may be greater than an area in which the component 20 may be located or disposed. Thus, the area of the opening 1750P provided in the lower protective film 175 may be different from the area of the second area 2A. For example, the area of the opening 1750P may be less than the area of the second area 2A.

Components 20 may be arranged or disposed in the second area 2A. The components 20 may have different functions.

Figure 4:
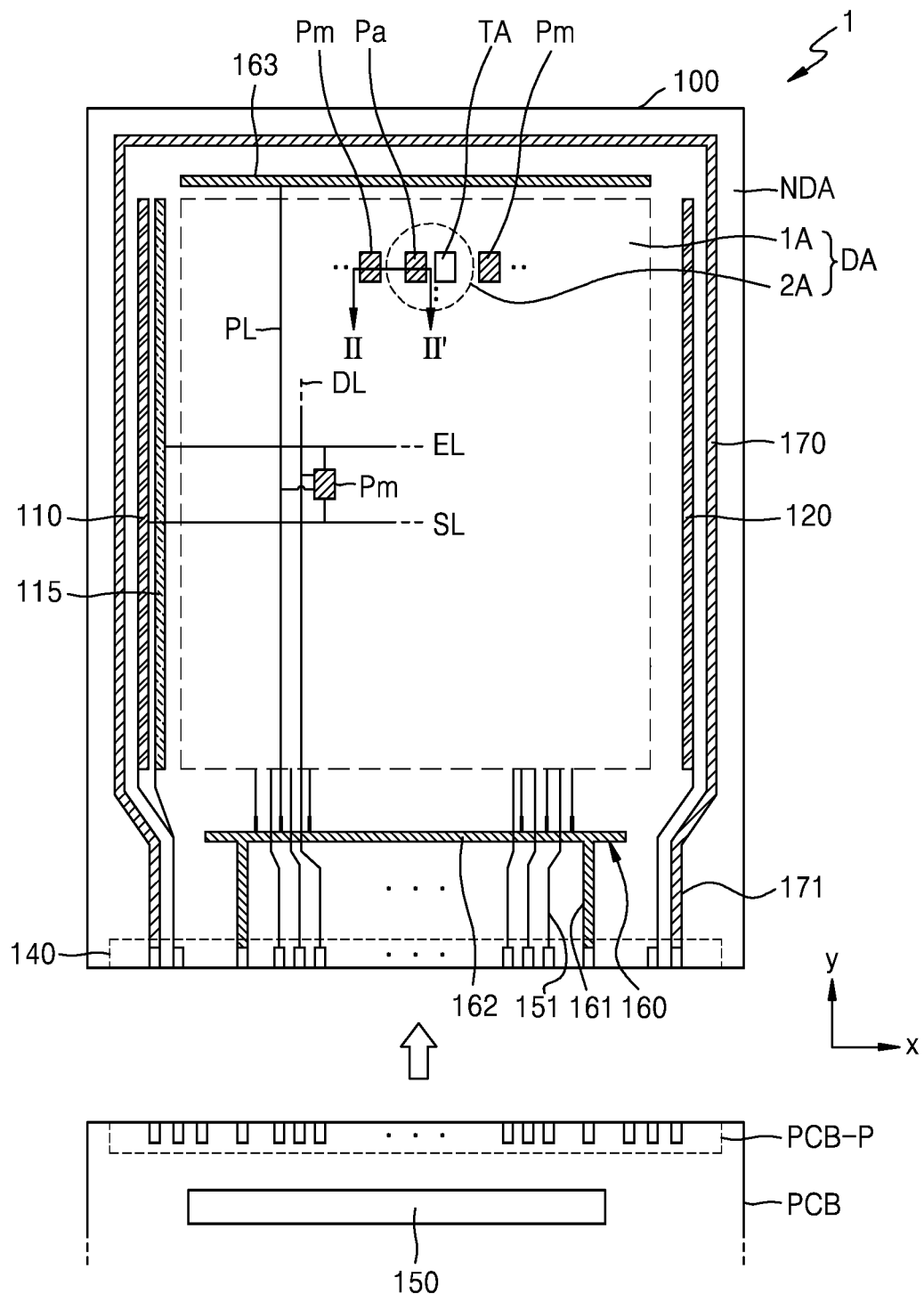
FIG. 4 is a plan view schematically illustrating a display device according to an embodiment.

FIG. 4 is a plan view schematically illustrating a display device according to an embodiment.

Referring to FIG. 4, a variety of components that constitute the display device 1 may be arranged or disposed on the substrate 100. The substrate 100 may include a display area DA and a non-display area NDA surrounding or adjacent to the display area DA. The display area DA may include a first area 1A and a second area 2A. The display area DA may be covered or overlapped by the encapsulation member described with reference to FIGS. 3A and 3B described above and may be protected from external air or moisture.

The display device 1 may include main pixels Pm arranged or disposed in the first area 1A. Each of the main pixels Pm may include a display element, such as an organic light-emitting diode. Each main pixel Pm may emit red, green, blue, or white light, for example, from the organic light-emitting diode. The main pixel Pm in the specification may be understood as a pixel that may emit light of any one of red, green, blue, and white colors, as described above.

The second area 2A may be located or disposed at a side of the first area 1A, and auxiliary pixels Pa may be arranged or disposed in the second area 2A. Each of the auxiliary pixels Pa may include a display element, such as an organic light-emitting diode. Each auxiliary pixel Pa may emit red, green, blue, or white light, for example, from the organic light-emitting diode. The auxiliary pixel Pa used herein may be understood as a pixel that may emit light of any one of red, green, blue, and white colors, as described above. The transmission area TA may be in the second area 2A and may be arranged or disposed between the auxiliary pixels Pa. At least one component 20 may be arranged or disposed to correspond to a lower portion of the second area 2A of the display device 1.

In an embodiment, one main pixel Pm and one auxiliary pixel Pa may include the same pixel circuit. However, embodiments are not limited thereto. A pixel circuit included in the main pixel Pm and a pixel circuit included in the auxiliary pixel Pa may also be different from each other.

Because the second area 2A may include the transmission area TA, the resolution of the second area 2A may be lower than that of the first area 1A. For example, the resolution of the second area 2A may be about ½ of the resolution of first area 1A. In an embodiment, the resolution of the first area 1A may be about 400 ppi or higher, and the resolution of the second area 2A may be about 100 ppi.

Each of the main and auxiliary pixels Pm and Pa may be electrically connected to outer circuits arranged or disposed in the non-display area NDA. A first scan driving circuit 110, a first emission driving circuit 115, a second scan driving circuit 120, a terminal 140, a data driving circuit 150, a first power supply line 160, and a second power supply line 170 may be arranged or disposed in the non-display area NDA.

The first scan driving circuit 110 may provide a scan signal to each of the main and auxiliary pixels Pm and Pa through the scan line SL. The first emission driving circuit 115 may provide an emission control signal to each pixel through the emission control line EL. The second scan driving circuit 120 may be arranged or disposed in parallel to the first scan driving circuit 110 with the display area DA therebetween. Part of the main and auxiliary pixels, Pm and Pa, arranged or disposed in the display area DA may be electrically connected to the first scan driving circuit 110, and the other part thereof may be electrically connected to the second scan driving circuit 120. In an embodiment, a second emission driving circuit (not shown) may be arranged or disposed in parallel to the first emission driving circuit 115 with the display area DA therebetween.

The first emission driving circuit 115 may be apart from the first scan driving circuit 110 in an x-direction and may be arranged or disposed in the non-display area NDA. In an embodiment, the first emission driving circuit 115 may be alternately arranged or disposed in a y-direction with the first scan driving circuit 110.

The terminal 140 may be arranged or disposed at a side of the substrate 100. The terminal 140 may not be covered or overlapped by an insulating layer but may be exposed and thus may be electrically connected to a printed circuit board PCB. A terminal PCB-P of the printed circuit board PCB may be electrically connected to the terminal 140 of the display device 1. The printed circuit board PCB may transmit a signal or power of a controller (not shown) to the display device 1. A control signal generated by the controller (not shown) may be transmitted to the first scan driving circuit 110, the first emission driving circuit 115, and the second scan driving circuit 120 through the printed circuit board PCB. The controller (not shown) may provide a first power supply voltage and a second power supply voltage to the first power supply line 160 and the second power supply line 170 through a first connection line 161 and a second connection line 171, respectively. A first power supply voltage ELVDD may be provided to each of the main and auxiliary pixels Pm and Pa through a driving voltage line PL electrically connected to the first power supply line 160, and a second power supply voltage ELVSS may be provided to an opposite electrode of each of the main and auxiliary pixels Pm and Pa electrically connected to the second power supply line 170.

The data driving circuit 150 may be electrically connected to the data line DL. A data signal of the data driving circuit 150 may be provided to each of the main and auxiliary pixels, Pm and Pa, through a connection line 151 electrically connected to the terminal 140 and the data line DL electrically connected to the connection line 151. FIG. 4 illustrates that the data driving circuit 150 may be arranged or disposed on the printed circuit board PCB. However, in an embodiment, the data driving circuit 150 may be arranged or disposed on the substrate 100. For example, the data driving circuit 150 may be arranged or disposed between the terminal 140 and the first power supply line 160.

The first power supply line 160 may include a first sub-line 162 and a second sub-line 163, which may extend in parallel to each other in the x-direction, with the display area DA between the first sub-line 162 and the second sub-line 163. The second power supply line 170 may have a substantially loop shape with one open side and may partially surround the display area DA.

Figure 5:
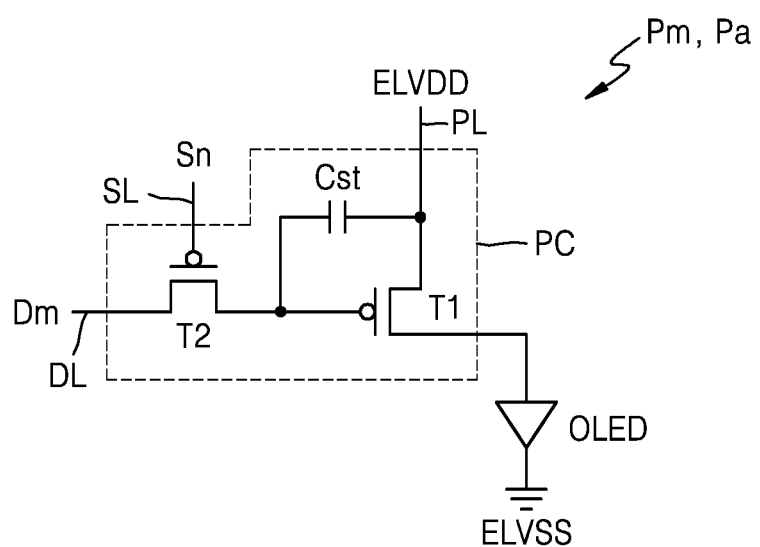
FIGS. 5 and 6 are equivalent circuit diagrams of pixels that may be included in a display device according to an embodiment.
Figure 6:
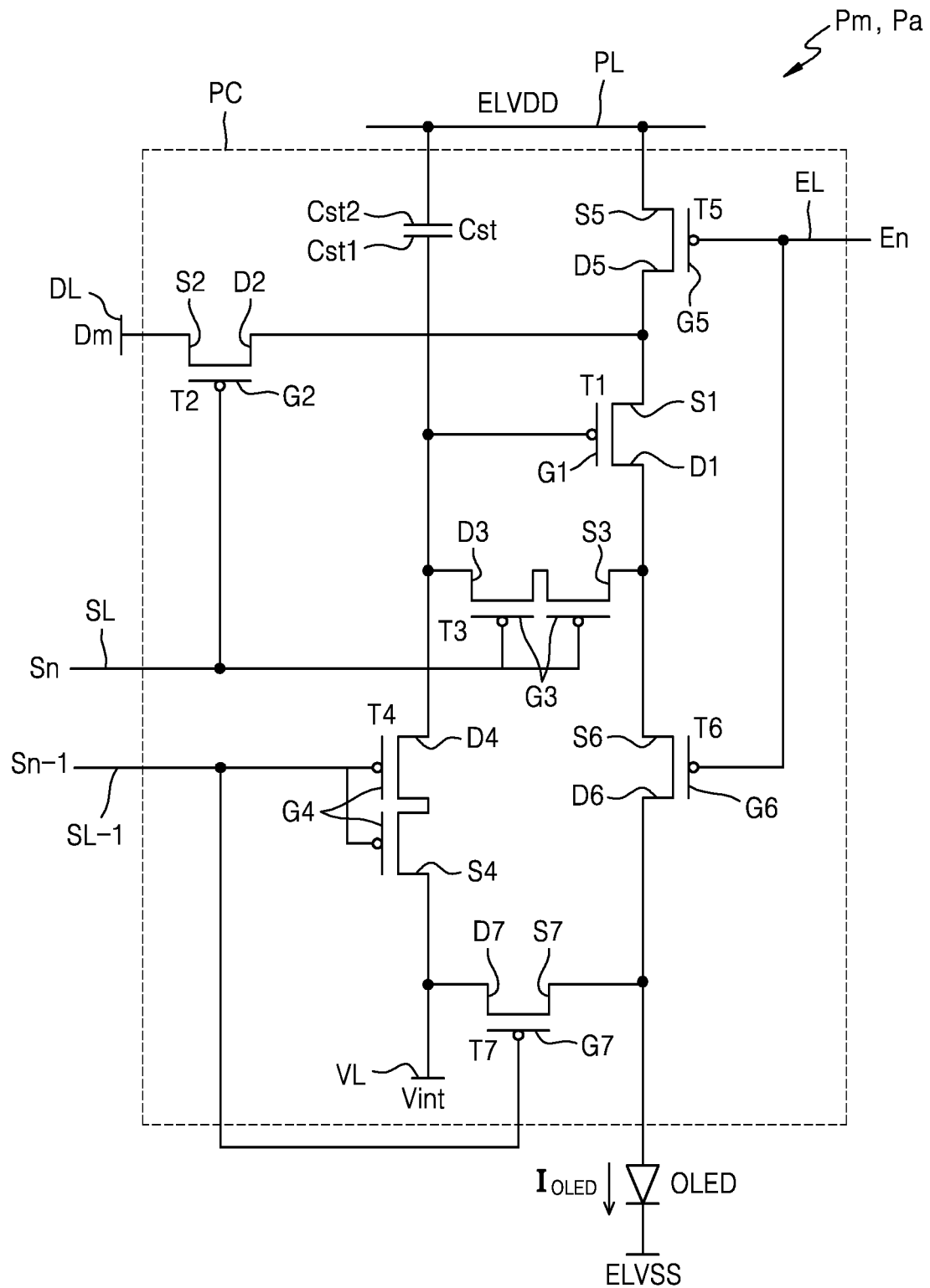

FIGS. 5 and 6 are equivalent circuit diagrams of pixels that may be included in a display device according to an embodiment.

Referring to FIG. 5, each of the main and auxiliary pixels Pm and Pa may include a pixel circuit PC electrically connected to the scan line SL and the data line DL and an organic light-emitting diode OLED electrically connected to the pixel circuit PC.

The pixel circuit PC may include a driving thin-film transistor T1, a switching thin-film transistor T2, and a storage capacitor Cst. The switching thin-film transistor T2 may be electrically connected to the scan line SL and the data line DL and may transmit a data signal Dm input through the data line DL according to a scan signal Sn input through the scan line SL to the driving thin-film transistor T1.

The storage capacitor Cst may be electrically connected to the switching thin-film transistor T2 and the driving voltage line PL and may store a voltage corresponding to a difference between a voltage transmitted from the switching thin-film transistor T2 and the first power supply voltage (or a driving voltage) ELVDD supplied to the driving voltage line PL.

The driving thin-film transistor T1 may be electrically connected to the driving voltage line PL and the storage capacitor Cst and may control a driving current that flows through the organic light-emitting diode OLED from the driving voltage line PL in correspondence with a voltage value stored in the storage capacitor Cst. The organic light-emitting diode OLED may emit light having certain brightness according to the driving current.

In FIG. 5, the pixel circuit PC includes two thin-film transistors and one storage capacitor. However, embodiments are not limited thereto. As shown in FIG. 6, the pixel circuit PC may include seven thin-film transistors and one storage capacitor.

Referring to FIG. 6, each of the main and auxiliary pixels Pm and Pa may include a pixel circuit PC and an organic light-emitting diode OLED electrically connected to the pixel circuit PC. The pixel circuit PC may include thin-film transistors and a storage capacitor. The thin-film transistors and the storage capacitor may be electrically connected to signal lines SL, SL-1, EL and DL, an initialization voltage line VL, and the driving voltage line PL.

In FIG. 6, each of the main and auxiliary pixels Pm and Pa may be electrically connected to the signal lines SL, SL-1, EL and DL, the initialization voltage line VL, and the driving voltage line PL. However, embodiments are not limited thereto. In an embodiment, at least one of the signal lines SL, SL-1, EL and DL, the initialization voltage line VL, and the driving voltage line PL may be shared in adjacent pixels.

The thin-film transistors may include a driving thin-film transistor TFT T1, a switching TFT T2, a compensation TFT T3, a first initialization TFT T4, an operation control TFT T5, an emission control TFT T6, and a second initialization TFT T7.

The signal lines may include the signal line SL that may transmit the scan signal Sn, a previous scan line SL-1 that may transmit the previous scan signal Sn-1 to the first initialization TFT T4 and the second initialization TFT T7, the emission control line EL that may transmit the emission control signal En to the operation control TFT T5 and the emission control TFT T6, and the data line DL intersecting with the scan line SL and transmitting the data signal Dm. The driving voltage line PL may transmit the first power supply voltage (or driving voltage) ELVDD to the driving TFT T1, and the initialization voltage line VL may transmit the initialization voltage Vint that may initialize the driving TFT T1 and a pixel electrode of the organic light-emitting diode OLED.

A driving gate electrode G1 of the driving TFT T1 may be electrically connected to a first storage capacitor plate Cst1 of the storage capacitor Cst, a driving source electrode S1 of the driving TFT T1 may be electrically connected to the driving voltage line PL via the operation control TFT T5, and a driving drain electrode D1 of the driving TFT T1 may be electrically connected to the pixel electrode of the organic light-emitting diode OLED via the emission control TFT T6. The driving TFT T1 may supply a driving current $I_{OLED}$ to the organic light-emitting diode OLED by receiving the data signal Dm according to a switching operation of the switching TFT T2.

A switching gate electrode G2 of the switching TFT T2 may be electrically connected to the scan line SL, a switching source electrode S2 of the switching TFT T2 may be electrically connected to the data line DL, and a switching drain electrode D2 of the switching TFT T2 may be electrically connected to the driving source electrode S1 of the driving TFT T1 and may be electrically connected to the driving voltage line PL via the operation control TFT T5. The switching TFT T2 may be turned on according to the scan signal Sn received through the scan line SL and may perform a switching operation of transmitting the data signal Dm transmitted to the data line DL to the driving source electrode S1 of the driving TFT T1.

A compensation gate electrode G3 of the compensation TFT T3 may be electrically connected to the scan line SL, a compensation source electrode S3 of the compensation TFT T3 may be electrically connected to the driving drain electrode D1 of the driving TFT T1 and electrically connected to the pixel electrode of the organic light-emitting diode OLED via the emission control TFT T6, a compensation drain electrode D3 of the compensation TFT T3 may be electrically connected to the first storage capacitor plate Cst1 of the storage capacitor Cst, the first initialization drain electrode D4 of the first initialization TFT T4, and the driving gate electrode G1 of the driving TFT T1. The compensation TFT T3 may be turned on according to the scan signal Sn transmitted through the scan line SL and may electrically connect the driving gate electrode G1 to the driving drain electrode D1 of the driving TFT T1, thereby diode-connecting the driving TFT T1.

A first initialization gate electrode G4 of the first initialization TFT T4 may be electrically connected to the previous scan line SL-1, a first initialization source electrode S4 of the first initialization TFT T4 may be electrically connected to a second initialization drain electrode D7 of the second initialization TFT T7 and the initialization voltage line VL, and a first initialization drain electrode D4 of the first initialization TFT T4 may be electrically connected to the first storage capacitor plate Cst1 of the storage capacitor Cst, the compensation drain electrode D3 of the compensation TFT T3, and the driving gate electrode G1 of the driving TFT T1. The first initialization TFT T4 may be turned on according to the previous scan signal Sn-1 transmitted through the previous scan line SL-1 and may perform an initialization operation of initializing a voltage of the driving gate electrode G1 of the driving TFT T1 by transmitting the initialization voltage Vint to the driving gate electrode G1 of the driving TFT T1.

An operation control gate electrode G5 of the operation control TFT T5 may be electrically connected to the emission control line EL, an operation control source electrode S5 of the operation control TFT T5 may be electrically connected to the driving voltage line PL, and an operation control drain electrode D5 of the operation control TFT T5 may be electrically connected to the driving source electrode S1 of the driving TFT T1 and the switching drain electrode D2 of the switching TFT T2.

An emission control gate electrode G6 of the emission control TFT T6 may be electrically connected to the emission control line EL, an emission control source electrode S6 of the emission control TFT T6 may be electrically connected to the driving drain electrode D1 of the driving TFT T1 and the compensation source electrode S3 of the compensation TFT T3, and an emission control drain electrode D6 of the emission control TFT T6 may be electrically connected to the second initialization source electrode S7 of the second initialization TFT T7 and the pixel electrode of the organic light-emitting diode OLED.

The operation control TFT T5 and the emission control TFT T6 may be simultaneously turned on according to the emission control signal En transmitted through the emission control line EL such that the first power supply voltage (driving voltage) ELVDD may be transmitted to the organic light-emitting diode OLED and thus the driving current $I_{OLED}$ may flow through the organic light-emitting diode OLED.

A second initialization gate electrode G7 of the second initialization TFT T7 may be electrically connected to the previous scan line SL-1, a second initialization source electrode S7 of the second initialization TFT T7 may be electrically connected to the emission control drain electrode D6 of the emission control TFT T6 and the pixel electrode of the organic light-emitting diode OLED, and a second initialization drain electrode D7 of the second initialization TFT T7 may be electrically connected to the first initialization source electrode S4 of the first initialization TFT T4 and the initialization voltage line VL. The second initialization TFT T7 may be turned on according to the previous scan signal Sn-1 transmitted through the previous scan line SL-1 and may initialize the pixel electrode of the organic light-emitting diode OLED.

In FIG. 6, the first initialization TFT T4 and the second initialization TFT T7 may be electrically connected to the previous scan line SL-1. However, embodiments are not limited thereto. In an embodiment, the first initialization TFT T4 may be electrically connected to the previous scan line SL-1 and may be driven according to the previous scan signal Sn-1, and the second initialization TFT T7 may be electrically connected to an additional signal line (for example, a subsequent scan line) and thus may be driven according to a signal transmitted to the signal line.

A second storage capacitor plate Cst2 of the storage capacitor Cst may be electrically connected to the driving voltage line PL, and the opposite electrode of the organic light-emitting diode OLED may be electrically connected to the second power supply voltage (or a common voltage) ELVSS. Thus, the organic light-emitting diode OLED may receive the driving current $I_{OLED}$ from the driving TFT T1 and may emit light, thereby displaying an image or images.

In FIG. 6, the compensation TFT T3 and the first initialization TFT T4 may have a dual gate electrode. However, the compensation TFT T3 and the first initialization TFT T4 may have one gate electrode.

In an embodiment, the main pixel Pm and the auxiliary pixel Pa may have the same pixel circuit PC. However, embodiments are not limited thereto. The main pixel Pm and the auxiliary pixel Pa may also have pixel circuits PC having different structures. There may be a variety of modifications, wherein, for example, the main pixel Pm may employ the pixel circuit PC of FIG. 6, and the auxiliary pixel Pa may employ the pixel circuit PC of FIG. 5.

Figure 7A:
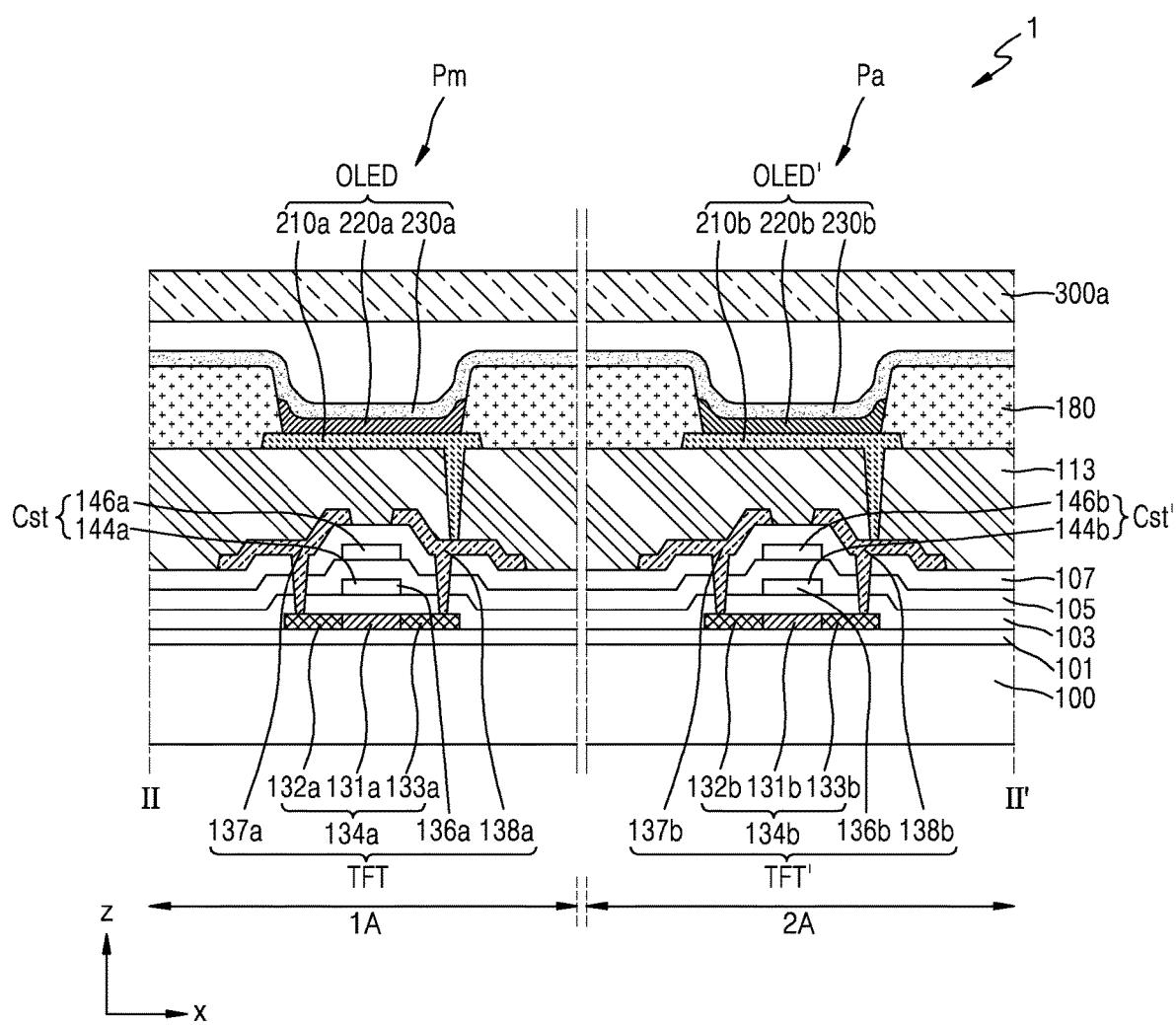
FIGS. 7A and 7B are schematic cross-sectional views of a main pixel and an auxiliary pixel that may be included in a display device according to an embodiment.
Figure 7B:
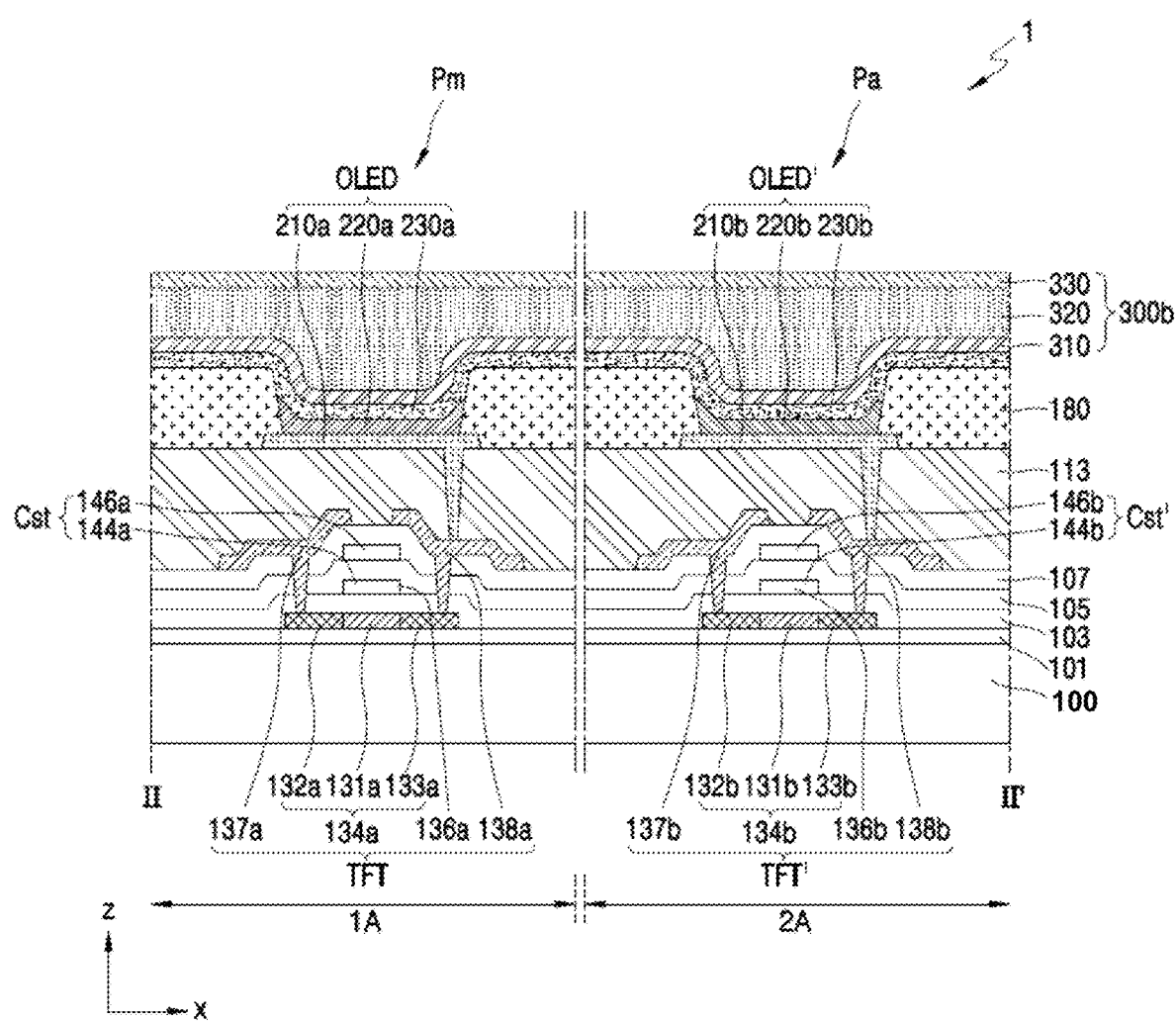

FIGS. 7A and 7B are schematic cross-sectional views of a main pixel and an auxiliary pixel that may be included in a display device according to an embodiment. In more detail, FIG. 7A is a schematic cross-sectional view of the main pixel Pm, and FIG. 7B is a schematic cross-sectional view of the auxiliary pixel Pa.

Hereinafter, a stack structure of a display device according to an embodiment will be described with reference to FIGS. 7A and 7B.

Referring to FIG. 7A, the display device 1 may include thin-film transistors TFT and TFT' arranged or disposed on the substrate 100 and organic light-emitting diodes OLED and OLED'. The substrate 100 may include a glass material or polymer resin having a main component of silicon oxide ($SiO_2$). The polymer resin may include polyethersulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may include a multi-layer structure including a layer including the above-described polymer resin and an inorganic layer (not shown).

The buffer layer 101 may be arranged or disposed on the substrate 100, may reduce or prevent the penetration of foreign substances, moisture, or external air from a lower portion of the substrate 100, and may provide a flat surface to the substrate 100. The buffer layer 101 may include an inorganic material, such as oxide or nitride, an organic material, or an organic/inorganic composite material and may have a single layer or multi-layer structure of an inorganic material and an organic material. A barrier layer (not shown) that may prevent the penetration of external air may be provided or disposed between the substrate 100 and the buffer layer 101.

A main thin-film transistor TFT and an auxiliary thin-film transistor TFT' may be arranged or disposed on the buffer layer 101. The main thin-film transistor TFT may include a main semiconductor layer 134a, a main gate electrode 136a, a main source electrode 137a, and a main drain electrode 138a, and the auxiliary thin-film transistor TFT' may include an auxiliary semiconductor layer 134b, an auxiliary gate electrode 136b, an auxiliary source electrode 137b, and an auxiliary drain electrode 138b. The main thin-film transistor TFT may be electrically connected to the main organic light-emitting diode OLED in the first area 1A and may drive the main organic light-emitting diode OLED. The auxiliary thin-film transistor TFT' may be electrically connected to the auxiliary organic light-emitting diode OLED' in the second area 2A and may drive the auxiliary organic light-emitting diode OLED'.

The main semiconductor layer 134a may be arranged or disposed on the buffer layer 101 and may include a main channel region 131a, a main source region 132a, and a main drain region 133a, wherein the main channel region 131a may overlap the main gate electrode 136a, and the main source region 132a and the main drain region 133a may each be at both sides of the main channel region 131a and may include impurities having higher concentrations than those of the main channel region 131a. The auxiliary semiconductor layer 134b may be arranged or disposed on the buffer layer 101 and may include an auxiliary channel region 131b, an auxiliary source region 132b, and an auxiliary drain region 133b, wherein the auxiliary channel region 131b may overlap the auxiliary gate electrode 136b, and the auxiliary source region 132b and the auxiliary drain region 133b each may be at both sides of the auxiliary channel region 131b and may include impurities having higher concentrations than those of the auxiliary channel region 131b. Here, the impurities may include N-type impurities or P-type impurities. Each of the main and auxiliary source regions 132a and 132b and the main and auxiliary drain regions 133a and 133b may be electrically connected to each of the main and auxiliary source electrodes 137a and 137b and the main and auxiliary drain electrodes 138a and 138b of the main and auxiliary thin-film transistors TFT and TFT'.

The main semiconductor layer 134a and the auxiliary semiconductor layer 134b may include an oxide semiconductor and/or a silicon semiconductor. When the main semiconductor layer 134a and the auxiliary semiconductor layer 134b are formed of an oxide semiconductor, the main semiconductor layer 134a and the auxiliary semiconductor layer 134b may include an oxide formed of at least one of materials, such as indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the main semiconductor layer 134a and the auxiliary semiconductor layer 134b may include InSnZnO (ITZO) and InGaZnO (IGZO), and the like within the spirit and the scope of the disclosure. When the main semiconductor layer 134a and the auxiliary semiconductor layer 134b include a silicon semiconductor, the main semiconductor layer 134a and the auxiliary semiconductor layer 134b may include amorphous silicon (a-Si) or low temperature poly-silicon (LTPS) formed by crystallizing a-Si.

The main gate electrode 136a and the auxiliary gate electrode 136b may be formed of one or more metals of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and may have a single layer or multi-layer structure. The main gate electrode 136a and the auxiliary gate electrode 136b may be electrically connected to a gate line that may apply an electrical signal to the main gate electrode 136a and the auxiliary gate electrode 136b.

A first insulating layer 103 may be disposed between the main semiconductor layer 134a and the main gate electrode 136a and between the auxiliary semiconductor layer 134b and the auxiliary gate electrode 136b. The first insulating layer 103 may include at least one inorganic insulating material of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single layer or multi-layer structure including the inorganic insulating materials described above.

A second insulating layer 105 may be provided or disposed on the first insulating layer 103 to cover or overlap the main gate electrode 136a and the auxiliary gate electrode 136b. The second insulating layer 105 may include at least one inorganic insulating material of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may have a single layer or multi-layer structure including the inorganic insulating materials described above.

A main storage capacitor Cst and an auxiliary storage capacitor Cst' may be arranged or disposed on the second insulating layer 105. The main storage capacitor Cst may include a main lower electrode 144a and a main upper electrode 146a, the main storage capacitor Cst may overlap the main thin-film transistor TFT, the main lower electrode 144a of the main storage capacitor Cst may be arranged or disposed as a one body with the main gate electrode 136a of the main thin-film transistor TFT. In an embodiment, the main storage capacitor Cst may not overlap the main thin-film transistor TFT, and the main lower electrode 144a of the main storage capacitor Cst may be an independent element formed separately from the main gate electrode 136a of the main thin-film transistor TFT. The auxiliary storage capacitor Cst' may include an auxiliary lower electrode 144b and an auxiliary upper electrode 146b. The auxiliary storage capacitor Cst' may overlap the auxiliary thin-film transistor TFT', and the auxiliary lower electrode 144b of the auxiliary storage capacitor Cst' may be arranged or disposed as a one body with the auxiliary gate electrode 136b of the auxiliary thin-film transistor TFT'. In an embodiment, the auxiliary storage capacitor Cst' may not overlap the auxiliary thin-film transistor TFT', and the auxiliary lower electrode 144b may be an independent element formed separately from the auxiliary gate electrode 136*b* of the auxiliary thin-film transistor TFT'.

The main upper electrode 146*a* and the auxiliary upper electrode 146*b* may include Al, Pt, Pd, Ag, Mg, Au, Ni, Nd, Ir, Cr, Li, Ca, Mo, Ti, W, and/or Cu and may have a single layer or multi-layer structure formed of the materials described above.

A third insulating layer 107 may be formed or disposed to cover or overlap the main upper electrode 146*a* and the auxiliary upper electrode 146*b*. The third insulating layer 107 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The main and auxiliary source electrodes 137*a* and 137*b* and the main and auxiliary drain electrodes 138*a* and 138*b* may be arranged or disposed on the third insulating layer 107. The main and auxiliary source electrodes 137*a* and 137*b* and the main and auxiliary drain electrodes 138*a* and 138*b* may include conductive materials including Mo, Al, Cu, and Ti and may have a multi-layer or single layer structure including the materials described above. In an example, the main and auxiliary source electrodes 137*a* and 137*b* and the main and auxiliary drain electrodes 138*a* and 138*b* may have a multi-layer structure of Ti/Al/Ti.

A planarization layer 113 may be arranged or disposed to cover or overlap the main and auxiliary source electrodes 137*a* and 137*b* and the main and auxiliary drain electrodes 138*a* and 138*b*. The planarization layer 113 may have a flat top surface so that the pixel electrode of the organic light-emitting diode OLED arranged or disposed on the planarization layer 113 may be formed substantially flat.

The planarization layer 113 may include a layer including an organic material or an inorganic material and may have a single layer or multi-layer structure. The planarization layer 113 may include a general-purpose polymer such as benzocyclobutene (BCB), polyimide, hexamethyldisiloxane (HMDSO), polymethylmethacrylate (PMMA), or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and/or a blend thereof. The planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the planarization layer 113 is formed or disposed, chemical mechanical polishing may be performed to provide a flat top surface to the planarization layer 113.

The planarization layer 113 may have an opening that may expose any one of the main source electrode 137*a* and the main drain electrode 138*a* of the main thin-film transistor TFT. A main pixel electrode 210*a* may be in electrical contact with the main source electrode 137*a* or the main drain electrode 138*a* through the opening and may be electrically connected to the main thin-film transistor TFT.

The planarization layer 113 may have an opening that may expose any one of the auxiliary source electrode 137*b* and the auxiliary drain electrode 138*b* of the auxiliary thin-film transistor TFT'. An auxiliary pixel electrode 210*b* may be in electrical contact with the auxiliary source electrode 137*b* or the auxiliary drain electrode 138*b* through the opening and may be electrically connected to the auxiliary thin-film transistor TFT'.

In the first area 1A of the substrate 100, a main organic light-emitting diode OLED may be positioned or disposed on the planarization layer 113, the main organic light-emitting diode OLED including the main pixel electrode 210*a*, a main intermediate layer 220*a*, and a main opposite electrode 230*a* facing the main pixel electrode 210*a* with the main intermediate layer 220*a* disposed between the main pixel electrode 210*a* and the main opposite electrode 230*a*.

In the second area 2A of the substrate 100, an auxiliary organic light-emitting diode OLED' may be positioned or disposed on the planarization layer 113, the auxiliary organic light-emitting diode OLED' including the auxiliary pixel electrode 210*b*, an auxiliary intermediate layer 220*b*, and an auxiliary opposite electrode 230*b* facing the auxiliary pixel electrode 210*b* with the auxiliary intermediate layer 220*b* disposed between the auxiliary pixel electrode 210*b* and the auxiliary opposite electrode 230*b*.

The main pixel electrode 210*a* and the auxiliary pixel electrode 210*b* may be arranged or disposed on the planarization layer 113. The main pixel electrode 210*a* and the auxiliary pixel electrode 210*b* may include a semi-transparent, a transparent electrode or a reflective electrode. The main pixel electrode 210*a* and the auxiliary pixel electrode 210*b* may include a reflective layer formed of Ag, Mg, Al, Pt, Pd, Au, Ni, Nd, Ir, Cr, and/or a compound thereof, and a transparent or semi-transparent electrode layer formed or disposed on the reflective layer. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The main pixel electrode 210*a* and the auxiliary pixel electrode 210*b* may have a stack structure of ITO/Ag/ITO.

A pixel-defining layer 180 may be arranged or disposed on the planarization layer 113. The pixel-defining layer 180 may have an opening that may expose at least part of the main pixel electrode 210*a* and an opening that may expose at least part of the auxiliary pixel electrode 210*b*. The pixel-defining layer 180 may increase a distance between edges of the main pixel electrode 210*a* and the main opposite electrode 230*a* on the main pixel electrode 210*a*, thereby preventing an arc from occurring in the edges of the main pixel electrode 210*a* and may increase a distance between edges of the auxiliary pixel electrode 210*b* and the auxiliary opposite electrode 230*b* on the auxiliary pixel electrode 210*b*, thereby preventing an arc from occurring in the edges of the auxiliary pixel electrode 210*b*. The pixel-defining layer 180 may be formed of organic insulating materials, such as polyimide, polyamide, acryl resin, BCB, HMDSO, and phenol resin, by using a method such as spin coating, for example.

The main intermediate layer 220*a* may be arranged or disposed on the main pixel electrode 210*a*, wherein at least part of the main pixel electrode 210*a* may be exposed by the pixel-defining layer 180, and the auxiliary intermediate layer 220*b* may be arranged or disposed on the auxiliary pixel electrode 210*b*. The main intermediate layer 220*a* and the auxiliary intermediate layer 220*b* may include a light-emitting layer and optionally, although not illustrated, may include functional layers, such as a hole transport layer (HTL), a hole injection layer (HIL), an electron transport layer (ETL), and an electron injection layer (EIL), which may be arranged or disposed under or below and on the light-emitting layer.

The light-emitting layer may include an organic material including a fluorescent or phosphorescent material that may emit red, green, blue, or white light. The light-emitting layer may include a small molecular weight organic material or polymer organic material.

When the light-emitting layer includes a small molecular weight material, the main intermediate layer 220a and the auxiliary intermediate layer 220b may have a structure in which, although not illustrated, an HIL, an HTL, an emission layer (EML), an ETL and an EIL may be stacked in a single or composite structure, and the small molecular weight organic material may include a variety of organic materials, such as copper phthalocyanine (CuPc), N,N'-Di (napthalene-1-yl)-N,N'-diphenyl-benzidine (NPB), and tris-8-hydroxyquinoline aluminum)(Alq3). These layers may be formed by using a method such as vacuum deposition, for example.

When the light-emitting layer includes a polymer material, the main intermediate layer 220a and the auxiliary intermediate layer 220b may have a structure usually including an HTL and an EML. In this case, the HTL may include poly-(3,4)-ethylene-dihydroxy thiophene (PEDOT), and the light-emitting layer may include a poly-phenylene vinylene (PPV)-based or polyfluorene-based polymer material. The light-emitting layer may be formed by using screen printing, inkjet printing, or laser induced thermal imaging (LITI), for example.

The main opposite electrode 230a may be arranged or disposed on the main intermediate layer 220a. The main opposite electrode 230a may be arranged or disposed on the main intermediate layer 220a to entirely cover or overlap the main intermediate layer 220a. The main opposite electrode 230a may be arranged or disposed over the first area 1A to entirely cover or overlap the first area 1A. For example, the main opposite electrode 230a may be formed as a one body to cover or overlap the main pixels Pm arranged or disposed in the first area 1A.

The auxiliary opposite electrode 230b may be arranged or disposed on the auxiliary intermediate layer 220b. The auxiliary opposite electrode 230b may be arranged or disposed on the auxiliary intermediate layer 220b to entirely cover or overlap the auxiliary intermediate layer 220b. The auxiliary opposite electrode 230b may be arranged or disposed over the second area 2A to entirely cover or overlap the second area 2A. For example, the auxiliary opposite electrode 230b may be formed as a one body to cover or overlap the auxiliary pixels Pa arranged or disposed in the second area 2A and may also be arranged or disposed on a transmission area TA provided or disposed in the second area 2A. As an example, the auxiliary opposite electrode 230b may be formed or disposed to cover or overlap the auxiliary pixels Pa in the second area 2A but may not be arranged or disposed on the transmission area TA in the second area 2A.

In an embodiment, the main opposite electrode 230a and the auxiliary opposite electrode 230b may be formed as one body. For example, the main opposite electrode 230a in the first area 1A may extend into the second area 2A and may be arranged or disposed even in the second area 2A.

The main opposite electrode 230a and the auxiliary opposite electrode 230b may include a conductive material having a small work function. For example, the main opposite electrode 230a and the auxiliary opposite electrode 230b may include a (semi-)transparent layer including Ag, Mg, Al, Pt, Pd, Au, Ni, Nd, Ir, Cr, Li, Ca, or an alloy thereof. Alternatively, the main opposite electrode 230a and the auxiliary opposite electrode 230b may include a layer such as ITO, IZO, ZnO, or $In_2O_3$ on the (semi-)transparent layer including the materials described above.

The main organic light-emitting diode OLED and the auxiliary organic light-emitting diode OLED' may be covered or overlapped by the encapsulation substrate 300a. The encapsulation substrate 300a may include a glass material. For example, the encapsulation substrate 300a may include a glass material having a main component of $SiO_2$. The encapsulation substrate 300a may face the substrate 100.

The embodiment of FIG. 7B may be different from the embodiment of FIG. 7A in that the display element layer may be covered or overlapped by the thin-film encapsulation layer 300b. A description of the same configuration of FIG. 7B as that of FIG. 7A will be omitted, and hereinafter, only a difference therebetween will be described.

Referring to FIG. 7B, the display element layer may be covered or overlapped by the thin-film encapsulation layer 300b. The thin-film encapsulation layer 300b may include at least one inorganic encapsulation layer and at least one organic encapsulation layer. In an embodiment, the thin-film encapsulation layer 300b may include first and second inorganic encapsulation layers 310 and 330 and an organic encapsulation layer 320 disposed therebetween.

Each of the first and second inorganic encapsulation layers 310 and 330 may include one or more inorganic insulating materials. The inorganic insulating materials may include aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include acryl-based resin, epoxy-based resin, polyimide, and/or polyethylene. For example, the organic encapsulation layer 320 may include acryl-based resin, for example, polymethylmethacrylate, polyacrylic acid, and the like within the spirit and the scope of the disclosure.

When the display panel includes the thin-film encapsulation layer 300b as an encapsulation member that may cover or overlap the display element layer, the display panel may have a smaller thickness or may be thinner than the thickness of the display panel described above in FIG. 7A.

Figure 8:
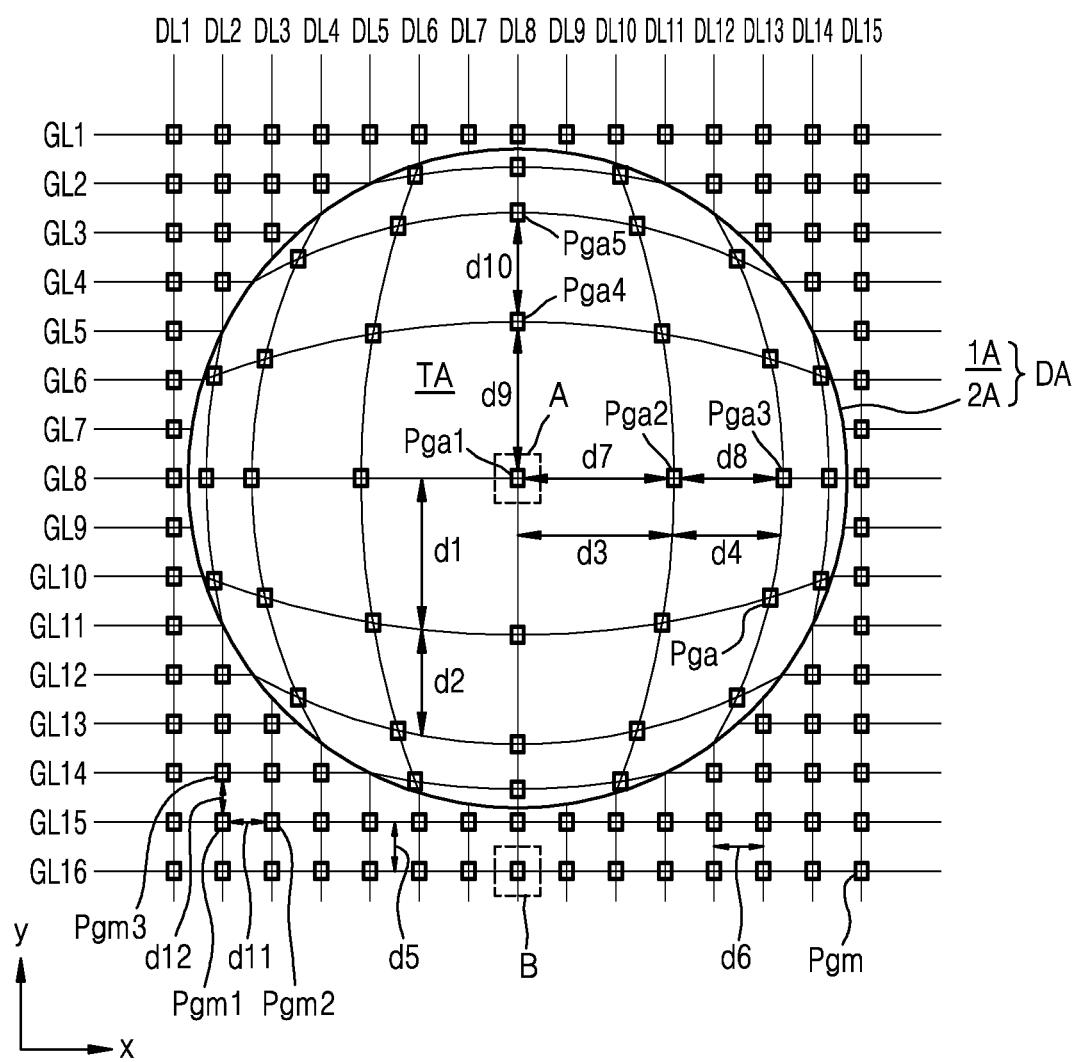
FIG. 8 is a plan view schematically illustrating a display device according to an embodiment.

FIG. 8 is a plan view schematically illustrating a display device according to an embodiment. In FIG. 8, for convenience of illustration and explanation, seven gate lines and seven data lines may be arranged or disposed in the second area 2A. However, each of the number of gate lines and the number of data lines may be substantially seven or more.

Referring to FIG. 8, the display device 1 according to an embodiment may include a substrate 100 including a first area 1A and a second area 2A having a transmission area TA, main pixel groups Pgm arranged or disposed in the first area 1A, auxiliary pixel groups Pga arranged or disposed in the second area 2A, first signal lines that may electrically connect the main pixel groups Pgm to the auxiliary pixel groups Pga and may extend in a first direction (x-direction), and second signal lines that may electrically connect the main pixel groups Pgm to the auxiliary pixel groups Pga and may extend in a second direction (y-direction) crossing or intersecting the first direction (x-direction).

In an embodiment, the first signal lines that may extend in the first direction (x-direction) may be gate lines GL1 through GL16, and the second signal lines that may extend in the second direction (y-direction) may be data lines DL1 through DL15. Each of the main pixel groups Pgm may include the main pixels Pm described above, and each of the auxiliary pixel groups Pga may include the auxiliary pixels Pa described above. For example, the gate lines GL1 through GL16 that may extend in the first direction (x-direction) may transmit the scan signal, the previous scan signal, and the emission control signal to the main pixels Pm and the auxiliary pixels Pa, and the data lines DL1 through DL15 may transmit the data signal and the driving voltage to the main pixels Pm and the auxiliary pixels Pa.

In an existing display device, there may be a problem that the gate lines extending in the first direction and the data lines extending in the second direction may be arranged or disposed in the second area having the transmission area by a certain or predetermined distance to form grating patterns. The grating patterns formed with the gate lines and the data lines may act as a diffraction grating and thus a blur image may be output when light emitted from a component (for example, an optical element) passes through the diffraction grating and is diffracted.

In order to solve the above-described problem, the disclosure may provide a display device having enhanced product reliability in which, in the second area 2A having the transmission area, a distance between the gate lines extending in the first direction (x-direction) and a distance between the data lines extending in the second direction (y-direction) may gradually decrease toward outer portions of the second area 2A from the center of the second area 2A such that the gate lines and the data lines may be prevented from acting as a diffraction grating.

A distance between the gate lines GL2, GL4, GL6, GL8, GL10, GL12, and GL14 extending in the first direction (x-direction) in the second area 2A may gradually decrease toward the outer portions of the second area 2A from the center of the second area 2A. As an example, a distance between closest gate lines may gradually decrease toward the second gate line GL2 and the fourteenth gate line GL14 arranged or disposed at the outer portions of the second area 2A from the eighth gate line GL8 arranged or disposed substantially in the center of the second area 2A in the first direction (x-direction). In an embodiment, a first distance d1 between the eighth gate line GL8 and the tenth gate line GL10 arranged or disposed substantially in the center of the second area 2A in the first direction (x-direction) may be greater than a second distance d2 between the tenth gate line GL10 and a twelfth gate line GL12.

A distance between the data lines DL2, DL4, DL6, DL8, DL10, DL12, and DL14 extending in the second direction (y-direction) in the second area 2A may gradually decrease toward the outer portions of the second area 2A from the center of the second area 2A. As an example, a distance between closest data lines may gradually decrease toward the second data line DL2 and the fourteenth data line DL14 arranged or disposed at the outer portions of the second area 2A from the eighth data line DL8 arranged or disposed substantially in the center of the second area 2A in the second direction (y-direction). In an embodiment, a third distance d3 between the eighth data line DL8 and the tenth data line DL10 arranged or disposed substantially in the center of the second area 2A in the second direction (y-direction) may be greater than a fourth distance d4 between the tenth data line DL10 and a twelfth data line DL12.

A distance between adjacent ones of the first signal lines arranged or disposed in the first area 1A may be less than or equal to a distance between adjacent ones of the first signal lines arranged or disposed in the second area 2A. As an example, a distance between the gate lines GL1 through GL16 extending in the first direction (x-direction) in the first area 1A may be less than or equal to a distance between the gate lines GL2, GL4, GL6, GL8, GL10, GL12, and GL14 extending in the first direction (x-direction) in the second area 2A. In an embodiment, a fifth distance d5 between a fifteenth gate line GL15 and a sixteenth gate line GL16 arranged or disposed in the first area 1A may be less than the first distance d1 between the eighth gate line GL8 and the tenth gate line GL10 arranged or disposed substantially in the center of the second area 2A and the second distance d2 between the tenth gate line GL10 and the twelfth gate line GL12.

A distance between the gate lines arranged or disposed in the second area 2A of the display device 1 may gradually decrease toward the outer portions of the second area 2A from the center of the second area 2A, and a minimum distance between the gate lines arranged or disposed in the second area 2A may be equal to a distance between the gate lines arranged or disposed in the first area 1A. Thus, the distance between the gate lines arranged or disposed in the second area 2A may gradually decrease to converge on the distance between the gate lines arranged or disposed in the first area 1A toward the outer portions of the second area 2A from the center of the second area 2A.

A distance between adjacent ones of second signal lines arranged or disposed in the first area 1A may be less than or equal to a distance between adjacent ones of second signal lines arranged or disposed in the second area 2A. As an example, the distance between the data lines DL1 through DL15 extending in the second direction (y-direction) in the first area 1A may be less than or equal to the distance between the data lines DL2, DL4, DL6, DL8, DL10, DL12, and DL14 extending in the second direction (y-direction) in the second area 2A. In an embodiment, a sixth distance d6 between the twelfth data line DL12 and the thirteenth data line DL13 arranged or disposed in the first area 1A may be less than the third distance d3 between the eighth data line DL8 and the tenth data line DL10 arranged or disposed substantially in the center of the second area 2A and less than the fourth distance d4 between the tenth data line DL10 and the twelfth data line DL12.

A distance between the data lines arranged or disposed in the second area 2A of the display device 1 may gradually decrease toward the outer portions of the second area 2A from the center of the second area 2A, and a minimum distance between the data lines arranged or disposed in the second area 2A may be equal to the distance between the data lines arranged or disposed in the first area 1A. Thus, the distance between the data lines arranged or disposed in the second area 2A may gradually decrease to converge on the distance between the data lines arranged or disposed in the first area 1A toward the outer portions of the second area 2A from the center of the second area 2A.

In an embodiment, a distance between the gate lines and the distance between the data lines arranged or disposed in the first area 1A may be in a range of about 50 μm to about 70 μm, and a distance between the gate lines and the data lines each adjacent to the gate lines and the data lines arranged or disposed substantially in the center of the second area 2A may be in a range of about 500 μm to about 700 μm. The distance between the gate lines and the data lines arranged or disposed in the second area 2A may gradually decrease toward the outer portions of the second area 2A from the center of the second area 2A and thus, a distance between the gate lines and the distance each adjacent to the gate lines and the data lines arranged or disposed in the outer portions of the second area 2A may be in a range of about 50 μm to about 70 μm.

The main pixel groups Pgm arranged or disposed in the first area 1A and the auxiliary pixel groups Pga arranged or disposed in the second area 2A may be electrically connected to the first signal lines extending in the first direction (x-direction). The main pixel groups Pgm arranged or disposed in the first area 1A and the auxiliary pixel groups Pga arranged or disposed in the second area 2A may be electrically connected to the second signal lines extending in the second direction (y-direction).

Because the second area 2A has the transmission area TA, the number of the auxiliary pixel groups Pga that may be arranged or disposed per unit area in the second area 2A may be less than the number of the main pixel groups Pgm arranged or disposed per unit area in the first area 1A.

Because the distance between the gate lines GL2, GL4, GL6, GL8, GL10, GL12, and GL14 extending in the first direction (x-direction) in the second area 2A may gradually decrease toward the outer portions of the second area 2A from the center of the second area 2A and the distance between the data lines DL2, DL4, DL6, DL8, DL10, DL12, and DL14 extending in the second direction (y-direction) in the second area 2A may gradually decrease toward the outer portions of the second area 2A from the center of the second area 2A, the distance between adjacent ones of the auxiliary pixel groups Pga arranged or disposed in the first direction (x-direction) and the second direction (y-direction) in the second area 2A may gradually decrease toward the outer portions of the second area 2A from the center of the second area 2A. In an embodiment, when an auxiliary pixel group Pga arranged or disposed in the center of the second area 2A may be referred to as a first auxiliary pixel group Pga1, an auxiliary pixel group Pga adjacent to the first auxiliary pixel group Pga1 in the first direction (x-direction) may be referred to as a second auxiliary pixel group Pga2 and an auxiliary pixel group Pga adjacent to the second auxiliary group Pga2 in the first direction (x-direction) may be referred to as a third auxiliary pixel group Pga3, a seventh distance d7 between the first auxiliary pixel group Pga1 and the second auxiliary pixel group Pga2 may be greater than an eighth distance d8 between the second auxiliary pixel group Pga2 and the third auxiliary pixel group Pga3. When an auxiliary pixel group Pga adjacent to the first auxiliary pixel group Pga1 arranged or disposed substantially in the center of the second area 2A may be referred to as a fourth auxiliary pixel group Pga4, an auxiliary pixel group Pga adjacent to the fourth auxiliary pixel group Pga4 in the second direction (y-direction) may be referred to as a fifth auxiliary pixel group Pga5, a ninth distance d9 between the first auxiliary pixel group Pga1 and the fourth auxiliary pixel group Pga4 may be greater than a tenth distance d10 between the fourth auxiliary pixel group Pga4 and the fifth auxiliary pixel group Pga5.

A distance between adjacent ones of the main pixel groups Pgm arranged or disposed in the first direction (x-direction) may be less than or equal to a distance between adjacent ones of the auxiliary pixel groups Pga arranged or disposed in the first direction (x-direction). As an example, when a main pixel group Pgm electrically connected to the fifteenth gate line GL15 and the second data line DL2 may be referred to as a first main pixel group Pgm1 and a main pixel group Pgm adjacent to the first main pixel group Pgm1 in the first direction (x-direction) may be referred to as a second main pixel group Pgm2, an eleventh distance d11 between the first main pixel group Pgm1 and the second main pixel group Pgm2 may be less than or equal to the seventh distance d7 between the first auxiliary pixel group Pga1 and the second auxiliary pixel group Pga2 and the eighth distance d8 between the second auxiliary pixel group Pga2 and the third auxiliary pixel group Pga3.

The distance between adjacent ones of the main pixel groups Pgm arranged or disposed in the second direction (y-direction) may be less than or equal to the distance between adjacent ones of the auxiliary pixel groups Pga arranged or disposed in the second direction (y-direction). As an example, when a main pixel group Pgm adjacent to the first main pixel group Pgm1 electrically connected to the fifteenth gate line GL15 and the second data line DL2 in the second direction (y-direction) may be referred to as a third main pixel group Pgm3, a twelfth distance d12 between the first main pixel group Pgm1 and the third main pixel group Pgm3 may be less than or equal to the ninth distance d9 between the first auxiliary pixel group Pga1 and the fourth auxiliary pixel group Pga4 and the tenth distance d10 between the fourth auxiliary pixel group Pga4 and the fifth auxiliary pixel group Pga5.

Figure 9A:
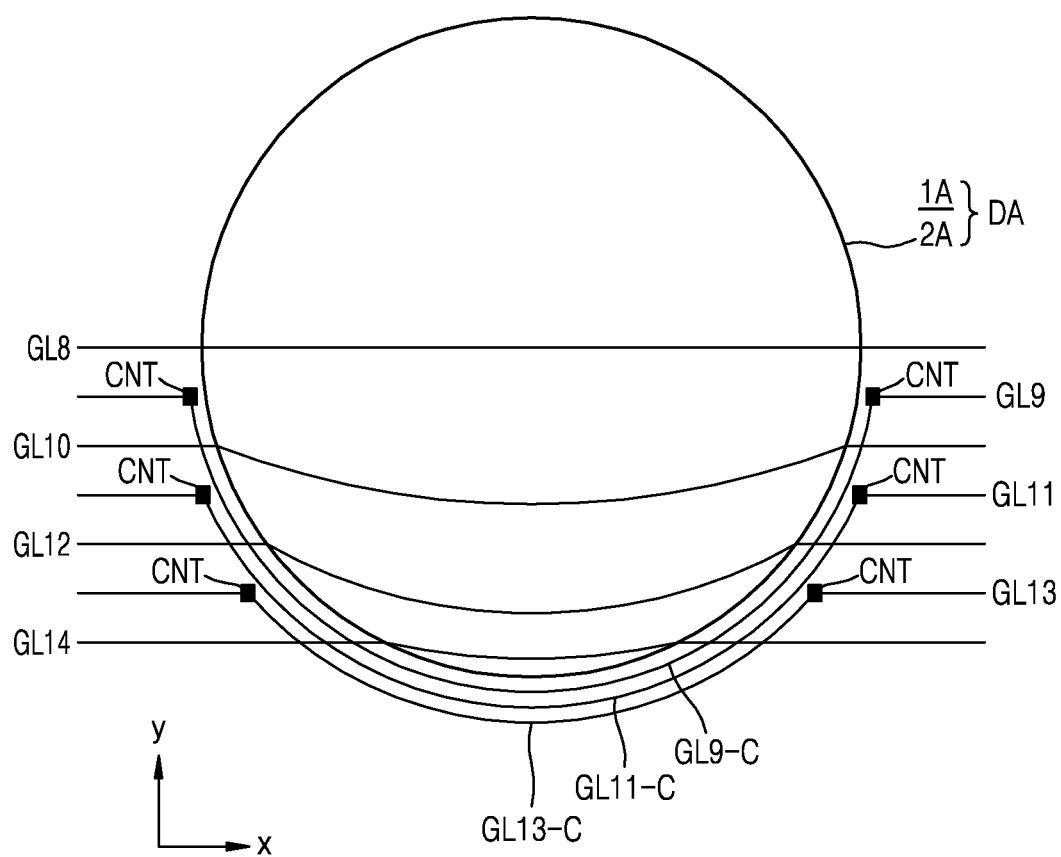
FIGS. 9A and 9B are plan views schematically illustrating a display device according to an embodiment.
Figure 9B:
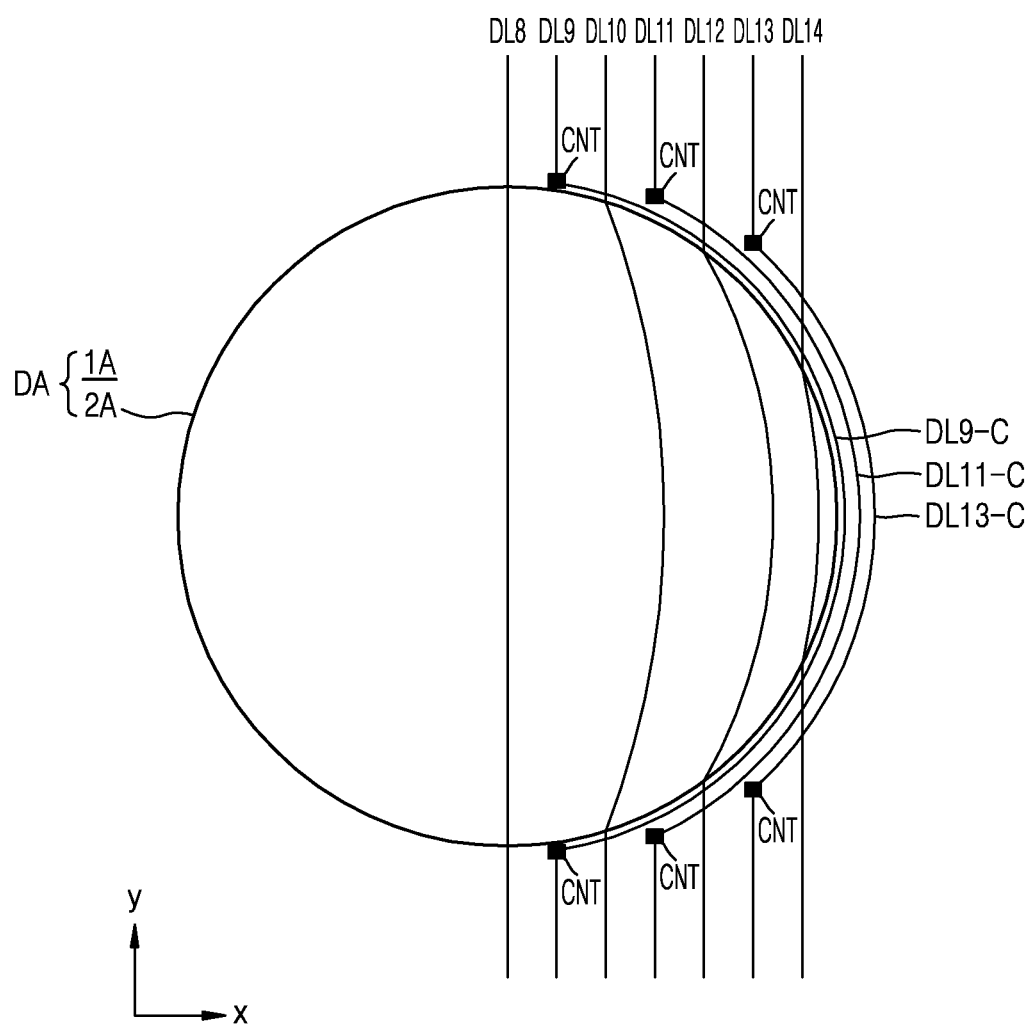

FIGS. 9A and 9B are plan views schematically illustrating a display device according to an embodiment. By way of an example, FIG. 9A is a view illustrating that at least one of the first signal lines extending in the first direction (x-direction) may be disconnected by the second area 2A therebetween and may be electrically connected by connection lines bypassing or disposed along edges of the second area 2A, and FIG. 9B is a view illustrating that at least one of the second signal lines extending in the second direction (y-direction) may be disconnected by the second area 2A therebetween and may be electrically connected by connection lines bypassing or disposed along edges of the second area 2A. In FIG. 9A, for convenience of illustration and explanation, three connection lines bypass or may be disposed along lower edges of the second area 2A. However, the number of connection lines bypassing or being disposed along the lower edges of the second area 2A may be substantially three or more, and the connection lines may bypass or be may disposed along upper edges of the second area 2A. Also, in FIG. 9B, for convenience of illustration and explanation, three connection lines bypass or may be disposed along right edges of the second area 2A. However, the number of connection lines bypassing or being disposed along the right edges of the second area 2A may be substantially three or more, and the connection lines may bypass or may be disposed along left edges of the second area 2A within the spirit and the scope of the disclosure.

In order to enhance transmittance of the second area 2A, a smaller number of signal lines than in the first area 1A may be arranged or disposed in the second area 2A. For example, in order to enhance transmittance of the second area 2A, the number of signal lines that may be arranged or disposed per unit area in the second area 2A may be less than the number of signal lines arranged or disposed per unit area in the first area 1A.

To this end, at least one of the first signal lines may include first signal lines extending in the first direction (x-direction) and disconnected by the second area 2A therebetween, and the disconnected first signal lines may be electrically connected to each other by the connection lines bypassing or being disposed along the edges of the second area 2A. As an example, referring to FIG. 9A, the gate lines GL9, GL11, and GL13 may extend in the first direction (x-direction), may be disconnected by the second area 2A therebetween and may be electrically connected by connection lines GL9-C, GL11-C, and GL13-C bypassing or being disposed along the edges of the second area 2A. Each of the gate lines GL9, GL11, and GL13 and the connection lines GL9-C, GL11-C, and GL13-C may be arranged or disposed on different layers and may be electrically connected to each other via a contact hole CNT or may also be arranged or disposed on the same layer.

At least one of the second signal lines may include second signal lines extending in the second direction (y-direction)

and disconnected by the second area 2A therebetween, and the disconnected second signal lines may be electrically connected to each other by the connection lines bypassing or being disposed along the edges of the second area 2A. As an example, referring to FIG. 9B, the data lines DL9, DL11, and DL13 may extend in the second direction (y-direction), may be disconnected by the second area 2A therebetween and may be electrically connected by the connection lines DL9-C, DL11-C, and DL13-C bypassing or being disposed along the edges of the second area 2A. Each of the data lines DL9, DL11, and DL13 and the connection lines DL9-C, DL11-C, and DL13-C may be arranged or disposed on different layers and electrically connected to each other via a contact hole CNT or may also be arranged or disposed on the same layer.

Figure 10A:
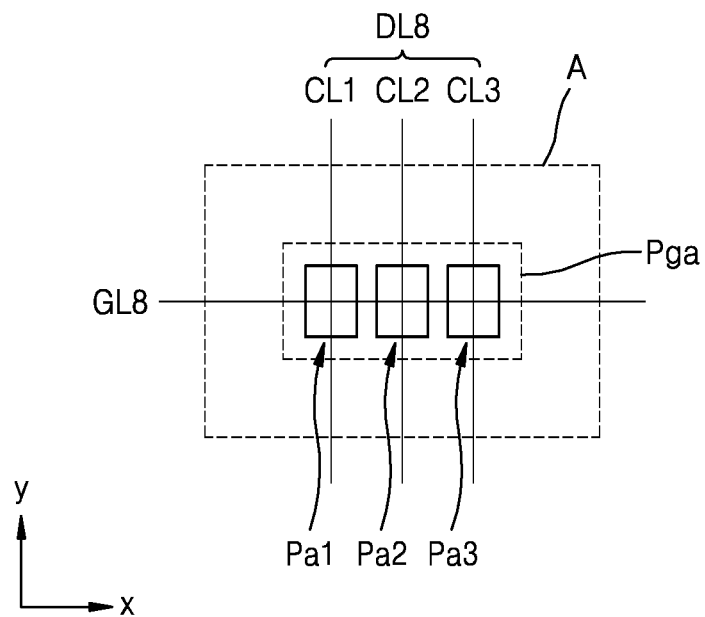
FIGS. 10A and 10B are plan views schematically illustrating a display device according to an embodiment.
Figure 10B:
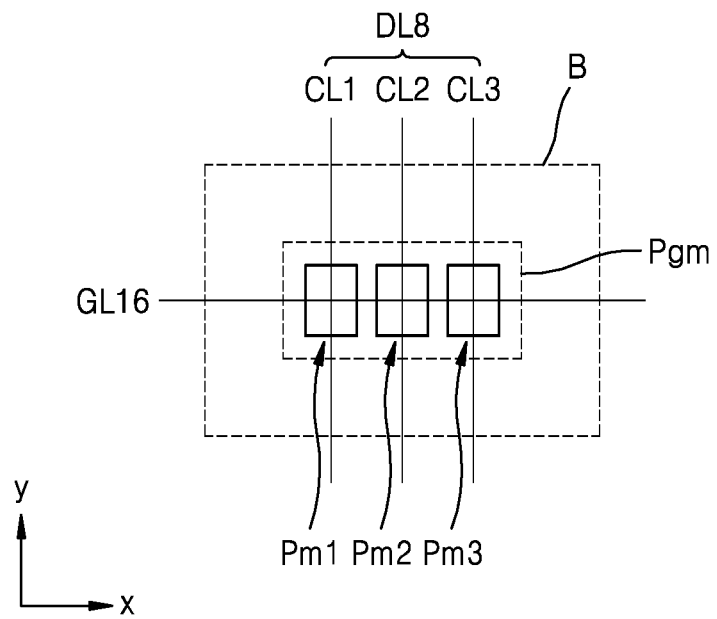

FIGS. 10A and 10B are plan views schematically illustrating a display device according to an embodiment. For example, FIG. 10A is av plan view enlarging region A of FIG. 8, and FIG. 10B is a plan view enlarging region B of FIG. 8.

Referring to FIG. 10A, each of the auxiliary pixel groups Pga may include a first auxiliary pixel Pa1, a second auxiliary pixel Pa2, and a third auxiliary pixel Pa3 that may emit lights of different wavelengths, and each of the second signal lines may include a first conductive line CL1, a second conductive line CL2, and a third conductive line CL3. As an example, the auxiliary pixel group Pga may include a first auxiliary pixel Pa1 that may emit light of a red wavelength, a second auxiliary pixel Pa2 that may emit light of a green wavelength, and a third auxiliary pixel Pa3 that may emit light of a blue wavelength. The first conductive line CL1 may be electrically connected to the first auxiliary pixel Pa1, the second conductive line CL2 may be electrically connected to the second auxiliary pixel Pa2, and the third conductive line CL3 may be electrically connected to the third auxiliary pixel Pa3.

In FIG. 10A, three auxiliary pixels Pa1, Pa2, and Pa3 may be included in one auxiliary pixel group Pga and arranged or disposed in one column. However, embodiments are not limited thereto. Four auxiliary pixels may be included in one auxiliary pixel group Pga and arranged or disposed in two columns, or eight auxiliary pixels may be included in one auxiliary pixel group Pga and arranged or disposed in four columns.

Referring to FIG. 10B, each of the main pixel groups Pgm may include a first main pixel Pm1, a second main pixel Pm2, and a third main pixel Pm3 that may emit lights of different wavelengths, and each of the second signal lines may include a first conductive line CL1, a second conductive line CL2, and a third conductive line CL3. As an example, the main pixel group Pgm may include a first main pixel Pm1 that may emit light of a red wavelength, a second main pixel Pm2 that may emit light of a green wavelength, and a third main pixel Pm3 that may emit light of a blue wavelength, and the first conductive line CL1 may be electrically connected to the first main pixel Pm1, and the second conductive line CL2 may be electrically connected to the second main pixel Pm2, and the third conductive line CL3 may be electrically connected to the third main pixel Pm3.

In FIG. 10B, three main pixels Pm1, Pm2, and Pm3 may be included in one main pixel group Pgm and arranged or disposed in one column. However, embodiments are not limited thereto. Four main pixels may be included in one main pixel group Pgm and arranged or disposed in two columns, or eight main pixels may be included in one main pixel group Pgm and arranged or disposed in four columns.

According to one or more embodiments, in order to solve a problem that, in a display device according to the related art, gate lines and data lines regularly arranged or disposed in an area in which a component may be located or disposed, act as a diffraction grating such that light emitted from the component passes through the diffraction grating and is diffracted and thus a blur image may be output, a distance between the gate lines arranged or disposed in the area in which the component may be located or disposed, and a distance between the data lines arranged or disposed in the area in which the component may be located or disposed, may be gradually decreased as getting closer to outer portions from substantially the center of the area so that the gate lines and the data lines may be prevented from acting as the diffraction grating and thus a display device having enhanced product reliability may be provided.

According to one or more embodiments described above, a display device having an enlarged display area in which an image or images may be displayed even in an area in which a component may be located or disposed, may be implemented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate comprising a first area and a second area, the second area having a transmission area;
   a plurality of main pixel groups disposed in the first area;
   a plurality of auxiliary pixel groups disposed in the second area; and
   a plurality of first signal lines electrically connected to the plurality of main pixel groups and the plurality of auxiliary pixel groups, wherein
   a distance between adjacent ones of the plurality of first signal lines electrically connected to the main pixel groups adjacent to each other in the first area is different from a distance between adjacent ones of the plurality of first signal lines electrically connected to the auxiliary pixel groups adjacent to each other in the second area, and
   a distance between adjacent ones of the plurality of first signal lines in the second area gradually decreases toward outer portions of the second area from a center of the second area.

2. The display device of claim 1, wherein the distance between adjacent ones of the plurality of first signal lines electrically connected to the main pixel groups adjacent to each other in the first area is less than or equal to the distance between adjacent ones of the plurality of first signal lines electrically connected to the auxiliary pixel groups adjacent to each other in the second area.

3. The display device of claim 2, further comprising:
   a plurality of second signal lines electrically connected to the plurality of main pixel groups and the plurality of auxiliary pixel groups,
   wherein a distance between adjacent ones of the plurality of second signal lines electrically connected to the main pixel groups adjacent to each other in the first area is different from a distance between adjacent ones of the plurality of second signal lines electrically connected to the auxiliary pixel groups adjacent to each other in the second area.

4. The display device of claim 3, wherein the distance between adjacent ones of the plurality of second signal lines electrically connected to the main pixel groups adjacent to each other in the first area is less than or equal to the distance between adjacent ones of the plurality of second signal lines electrically connected to the auxiliary pixel groups adjacent to each other in the second area.

5. The display device of claim 4, wherein the plurality of first signal lines extend in a first direction, and the plurality of second signal lines extend in a second direction intersecting the first direction.

6. The display device of claim 3, wherein a distance between adjacent ones of the plurality of second signal lines in the second area gradually decreases toward outer portions of the second area from a center of the second area.

7. The display device of claim 5, wherein a distance between adjacent ones of the plurality of auxiliary pixel groups disposed in the first direction gradually decreases toward outer portions of the second area from a center of the second area.

8. The display device of claim 5, wherein a distance between adjacent ones of the plurality of auxiliary pixel groups disposed in the second direction gradually decreases toward outer portions of the second area from a center of the second area.

9. The display device of claim 1, wherein at least one of the plurality of first signal lines comprises first signal lines extending in the first direction and being disconnected from each other by the second area between the disconnected first signal lines, and the disconnected first signal lines are electrically connected by connection lines disposed along edges of the second area.

10. The display device of claim 5, wherein at least one of the plurality of second signal lines comprises second signal lines extending in the second direction and being disconnected from each other by the second area between the disconnected second signal lines, and the disconnected second signal lines are electrically connected by connection lines disposed along edges of the second area.

11. The display device of claim 1, wherein each of the plurality of auxiliary pixel groups comprises a first auxiliary pixel, a second auxiliary pixel, and a third auxiliary pixel that emit light of different wavelengths.

12. The display device of claim 1, wherein each of the plurality of main pixel groups comprises a first main pixel, a second main pixel, and a third main pixel that emit light of different wavelengths.

13. The display device of claim 1, further comprising:

a component disposed below the substrate to correspond to the second area and comprising an electronic element emitting or receiving light.

14. The display device of claim 3, wherein a distance between adjacent ones of the plurality of second signal lines in the second area is different in an outer portion of the second area as compared to a center of the second area.

* * * * *